(12) United States Patent
Zenou et al.

(10) Patent No.: US 12,010,800 B2
(45) Date of Patent: Jun. 11, 2024

(54) SYSTEMS FOR SURFACE MOUNTING ELECTRONIC COMPONENTS ON A PRINTED CIRCUIT BOARD

(71) Applicant: IO Tech Group Ltd., London (GB)

(72) Inventors: Michael Zenou, Hashmonaim (IL); Ziv Gilan, Kfar-harif, IL (US); Guy Nesher, Nes Ziona (IL)

(73) Assignee: IO Tech Group Ltd., Modiin (IL)

( * ) Notice: Subject to any disclaimer, the term of this patent is extended or adjusted under 35 U.S.C. 154(b) by 436 days.

(21) Appl. No.: 17/305,108

(22) Filed: Jun. 30, 2021

(65) Prior Publication Data

US 2022/0071072 A1   Mar. 3, 2022

Related U.S. Application Data

(60) Provisional application No. 63/072,705, filed on Aug. 31, 2020, provisional application No. 63/090,408, filed on Oct. 12, 2020.

(51) Int. Cl.
*H05K 13/04* (2006.01)
*B65G 47/91* (2006.01)
*H05K 3/30* (2006.01)
*H05K 13/08* (2006.01)

(52) U.S. Cl.
CPC ......... *H05K 13/0409* (2018.08); *B65G 47/91* (2013.01); *H05K 3/301* (2013.01); *H05K 13/0812* (2018.08); *Y10T 29/53174* (2015.01)

(58) Field of Classification Search
CPC ........... H05K 13/0409; H05K 13/0812; H05K 3/301; Y10T 29/53174

USPC .......................... 29/739, 740, 743, 832, 836
See application file for complete search history.

(56) References Cited

U.S. PATENT DOCUMENTS

| 4,135,630 A | 1/1979 | Snyder et al. |
| 4,290,732 A | 9/1981 | Taki et al. |
| 4,381,601 A | 5/1983 | Tamai et al. |
| 5,278,634 A * | 1/1994 | Skunes .............. H05K 13/0812 356/400 |
| 7,746,481 B2 * | 6/2010 | Kranz .................. G01B 11/272 356/601 |
| 2015/0192923 A1 | 7/2015 | Apoorva et al. |

(Continued)

OTHER PUBLICATIONS

International Search Report and Written Opinion mailed Oct. 1, 2021, from ISA/European Patent Office, for International Patent Application No. PCT/IB2021/05581 (filed Jun. 30, 2021), 12 pgs.

*Primary Examiner* — Thiem D Phan
(74) *Attorney, Agent, or Firm* — Ascenda Law Group, PC

(57) ABSTRACT

In a first approach, a vacuum cell comprises a porous plate and a vacuum force generated by gas being drawn thorough the porous plate is used to pick electronic components from a donor substrate. After transport of the vacuum cell to a placing area, dots of liquid material may be deposited on a top surface of the porous plate adjacent to one or more picked components in order to disrupt the vacuum force and release the picked components onto a receiving substrate. In a refinement of the first approach, the porous plate contains a plurality of picking holes for selectively picking components. Certain picking holes can be fluidly coupled to the vacuum, allowing components to be attached within those picking holes, while other picking holes can be closed or rendered inactive with dots of liquid material deposited on a top surface of the porous plate.

16 Claims, 36 Drawing Sheets

(56) References Cited

U.S. PATENT DOCUMENTS

| | | |
|---|---|---|
| 2018/0351030 A1 | 12/2018 | Goward |
| 2019/0139794 A1 | 5/2019 | Saketi et al. |
| 2020/0070364 A1 | 3/2020 | Ahn et al. |
| 2020/0251373 A1 | 8/2020 | Ahn et al. |

* cited by examiner

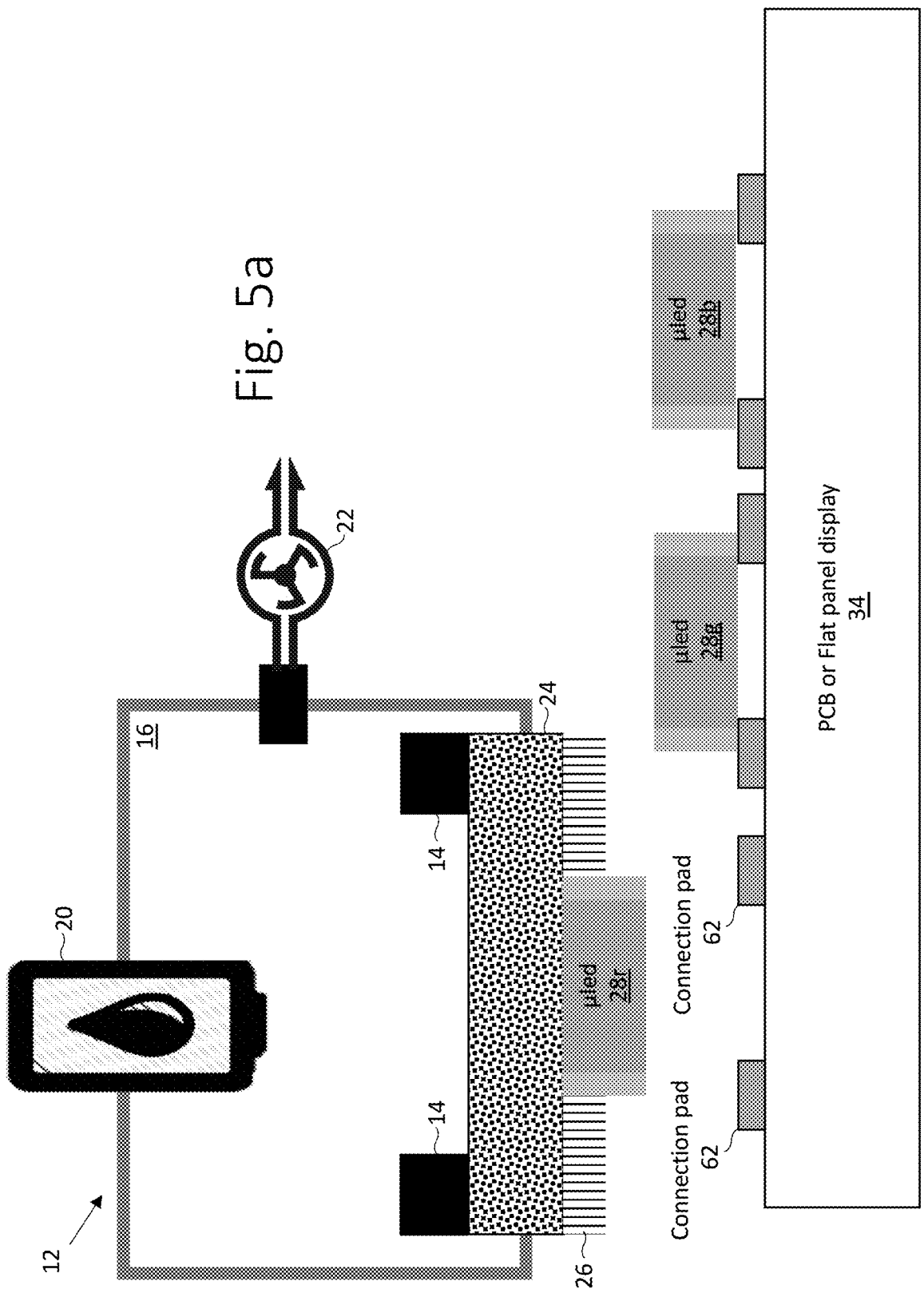

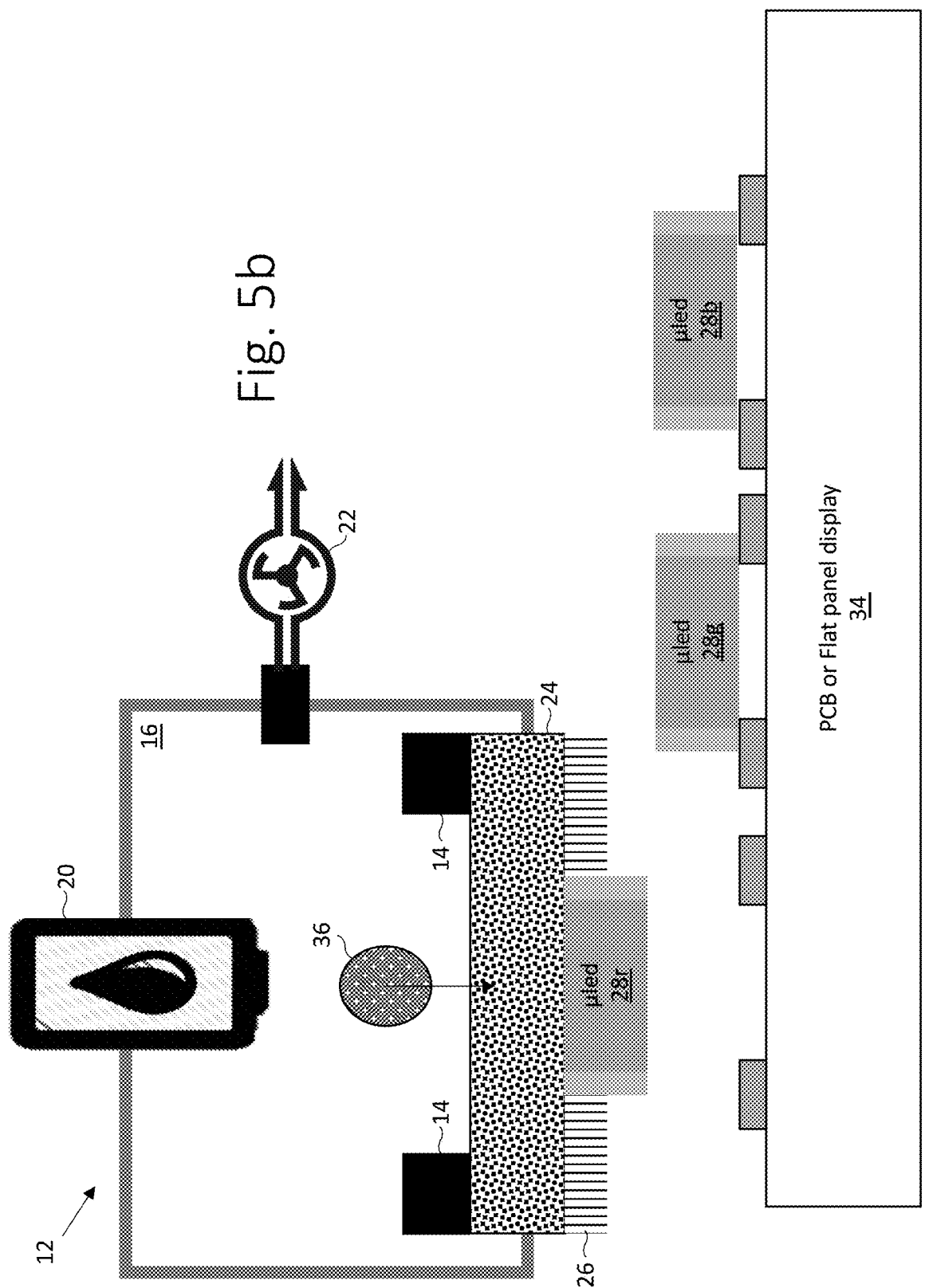

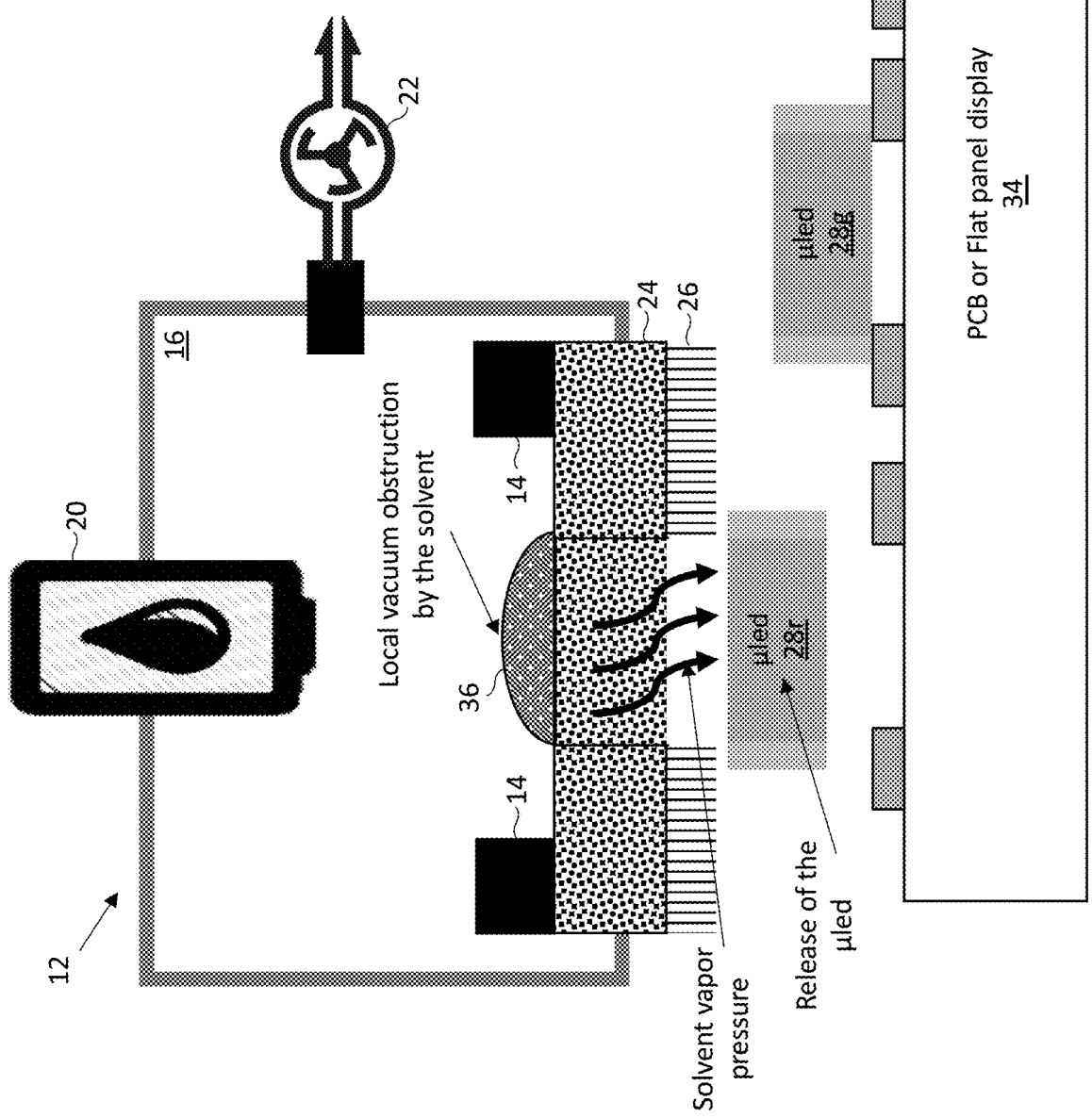

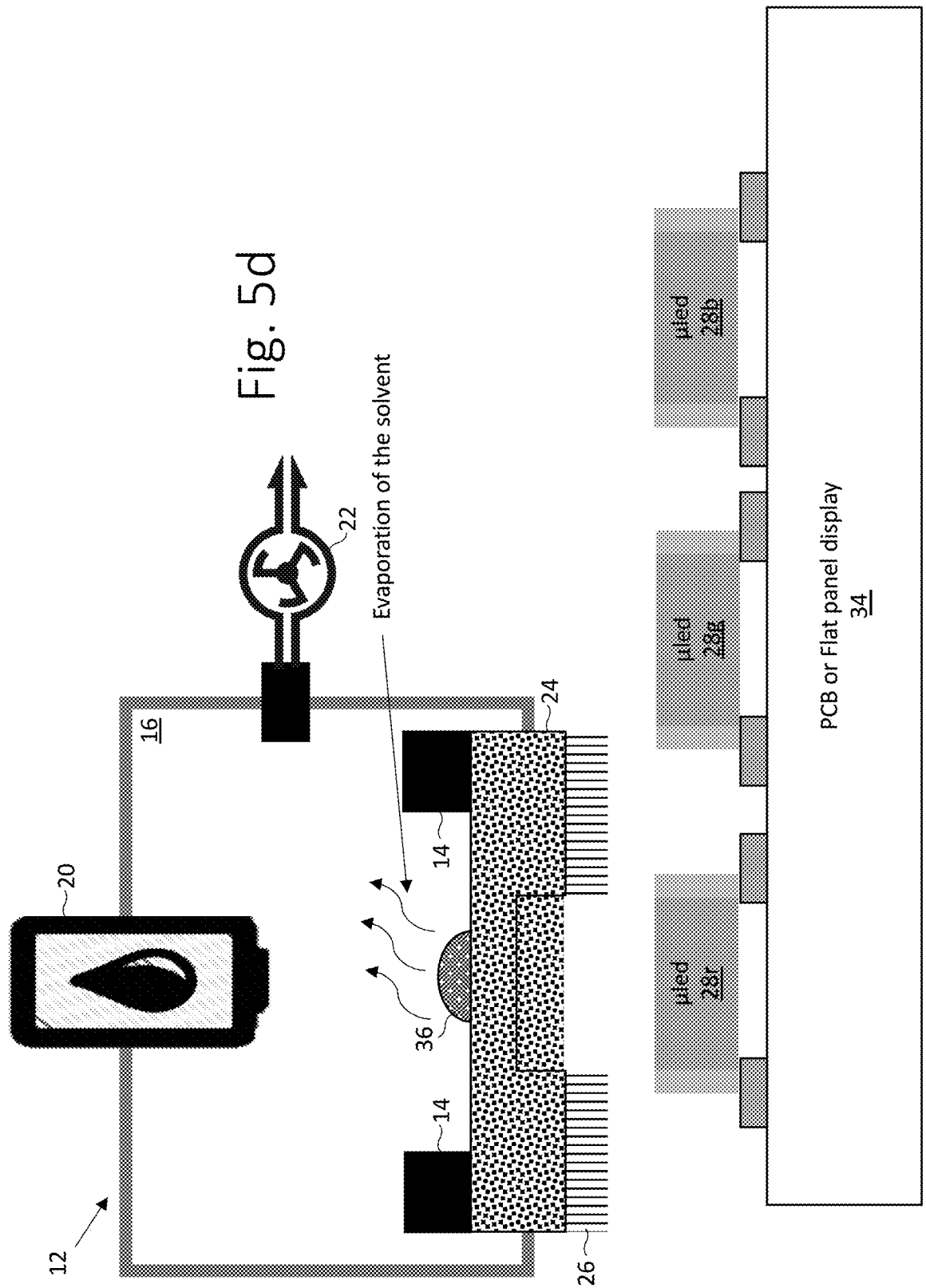

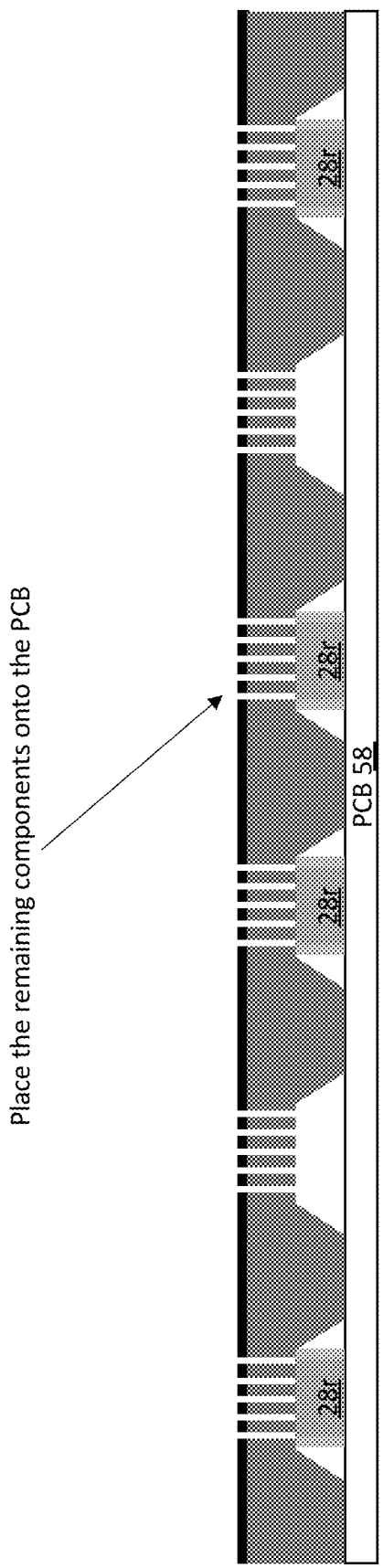

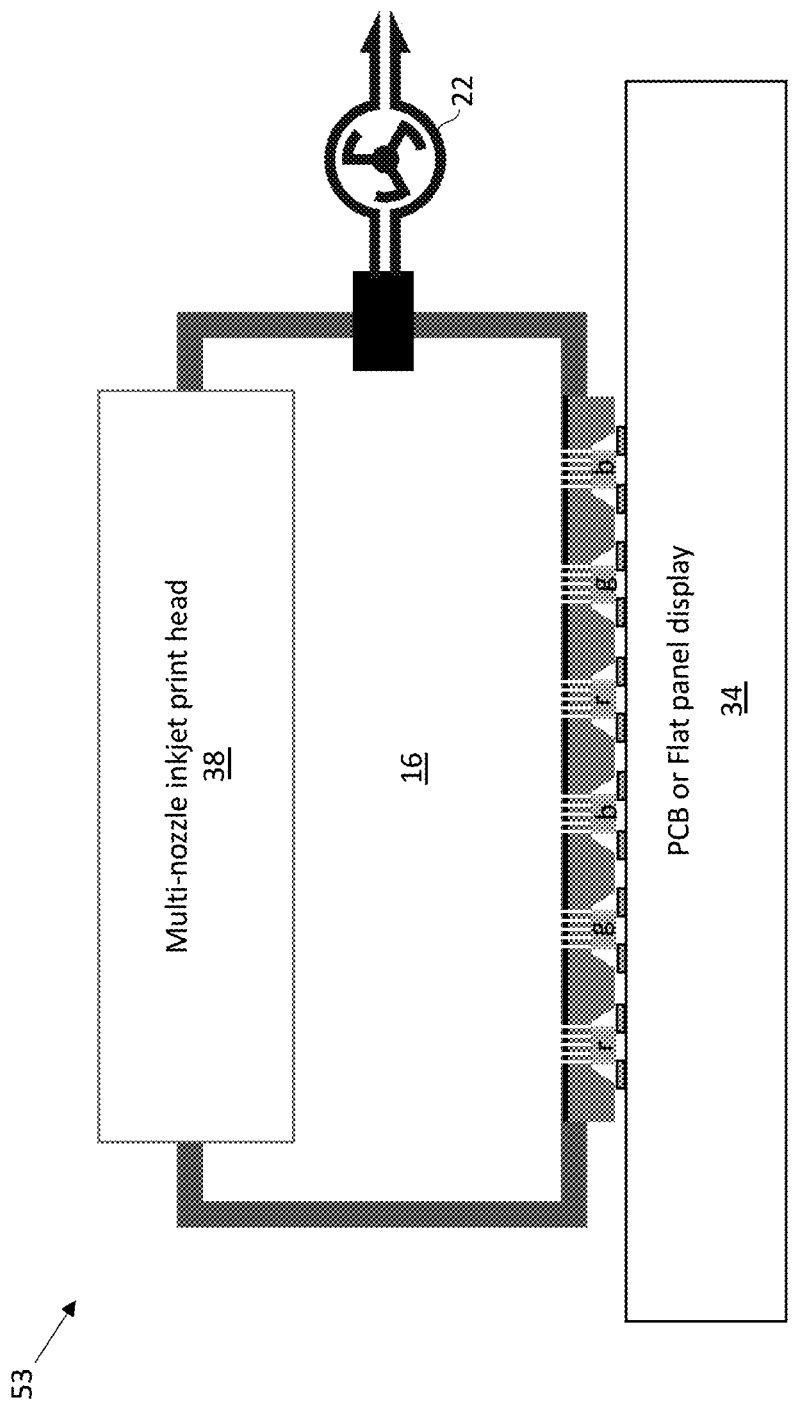

SYSTEMS FOR SURFACE MOUNTING ELECTRONIC COMPONENTS ON A PRINTED CIRCUIT BOARD

RELATED APPLICATIONS

This is a NONPROVISIONAL of, claims priority to, and incorporates by reference U.S. Provisional Application No. 63/072,705, filed 31 Aug. 2020 and U.S. Provisional Application No. 63/090,408, filed 12 Oct. 2020.

FIELD OF THE INVENTION

The present invention relates generally to pick and place systems and methods in which objects are picked from one location, transferred to another location, and placed in a precise position, and more specifically to systems and methods for object manipulation that utilizes inkjet and/or laser-based/laser-assisted printing in order to easily, carefully, and quickly pick and place objects, including micron sized objects, with high precision.

BACKGROUND

Surface Mount Technology (SMT) is an area of electronic assembly used to mount electronic components to the surface of a printed circuit board (PCB) as opposed to inserting components through holes, as with conventional assembly. SMT was developed to reduce manufacturing costs and allow efficient use of PCB space. As a result of the introduction of SMT, it is now possible to build highly complex electronic circuits into smaller and smaller assemblies with good repeatability due to the higher level of automation.

The mounting of discrete electrical components onto PCBs by automated means is well known. For a rather extended period of time, the electrical components, such as resistors, capacitors, inductors, and the like, included axial, radial, or in-line leads which extended through holes in the PCBs. Over the years, several types of apparatus have been developed to automate this procedure so as to increase production.

In previous systems, as exemplified by U.S. Pat. No. 4,381,601, electronic components such as semiconductor pellets or chips are temporarily attached to the tip end of an attraction (vacuum) nozzle, held, and automatically oriented by means of a plurality of arms arranged along the outer periphery of the tip end of the sucking nozzle. The held electronic component is then transferred to a predetermined bonding position on a semiconductor device substrate before the arms are opened to deposit the electronic component onto a predetermined bonding position for bonding. Although this apparatus is adequate for the task of picking up and depositing a component, it does not include a reliable and accurate means for transporting the component from an input station to a desired location and in exact registration with connection pads on a PCB.

In U.S. Pat. Nos. 4,135,630 and 4,290,732, machines are described for picking up electrical components and placing them at desired positions and orientations on a substrate. The pick-up heads of these machines utilize a vacuum or suction tool by which components are held on the pick-up head, and pawls or fingers are used to position the components on the tools. These devices work well with electrical components of a particular size and shape, but such components do not always have the same dimension. At best, these machines can handle a small range of sizes of components. However, it is frequently necessary to position a number of components of widely varying sizes and shapes on a single substrate, and the above-noted devices cannot provide sufficient accuracy and reliability with a single pick-up head without manually adjusting or changing the pawls or fingers, which is very inconvenient and time-consuming. Subsequently, this problem has been solved by providing a plurality of pick-up heads, each adapted to pick up a different size range of components.

Newer approaches suggest the use of electrowetting to manipulate objects, including micron sized objects, as described in U.S. PGPUB 2015/0192923. Electrowetting refers to the modification of a wetting property of a surface induced by an externally applied electric field. In this approach, one uses a plurality of electrically controlled nodes that switch their adhesion property depending on the applied voltage. Specifically, the electrically controlled nodes display hydrophilic forces to pick-up objects and reverse to hydrophobic forces to place objects. Nodes comprise an electrode element. In order for the nodes to exhibit hydrophilic forces or hydrophobic forces, the electrode element is coated with a dielectric element and a hydrophobic element. The micron sized objects to be picked up must be coated with a substance referred to herein as a "droplet." The droplet is of a substance that can be electrically controlled, for example, water. Specifically, the electrically controlled nodes are hydrophilic while picking the coated objects and reverse or "switch" to hydrophobic when placing them.

However, all the above approaches still require repeated translational movement from one side of the PCB to another and, therefore, are all limited by a mechanical arm speed.

SUMMARY OF THE INVENTION

In one embodiment of the invention, electronic devices are surface mounted on a PCB in a faster way as compared with conventional techniques by performing the picking and placing operations in parallel. The picking is performed by a vacuum while the placing is performed using a laser or an inkjet print head. Since this process is a continuous sequence production, the rate of component placement is improved over conventional processes.

In one embodiment of the invention, a porous substrate or a substrate with a micro hole array is held under vacuum and a series of components are picked up using a vacuum unit.

In some embodiments of the invention, a heating unit is added to control the temperature of the substrate and the rate of solvent evaporation.

In some embodiments of the invention, an inkjet head is added to the vacuum chamber and is used for the release of the components.

In a first step of a process according to an embodiment of the invention, a vacuum is applied to a closed cell to create a sub-pressure atmosphere. In a second step, a component is picked up by the vacuum chamber and held. Then, an optical inspection is used to detect the correct placement of the component both from the picking parameters (x, y, and rotation) and also from the placing parameters (x, y, rotation, and theta angle). To place the component in the correct location, an inkjet head or a laser is used to break the vacuum and to release the component by the aid of solvent vapor pressure.

In some embodiments of the invention, a vacuum pump is used to keep the closed cell under pressure.

In some embodiments of the invention, an inkjet print head is used for suppling a solvent, which is evaporated in a predetermined rate at the correct locations on the porous substrate or on the holes in the substrate, creating a local vapor pressure that is governed by the temperature of the substrate and the properties of the solvent. In some embodiments, the solvent may be chosen based on a vapor pressure of the solvent. More specifically, a vapor pressure of the solvent and a pressure inside the vacuum cell may be selected with respect to one another so that the solvent vaporizes upon the heating of the solvent.

In some embodiments of the invention, the inkjet print head is movable by a piezo X-Y actuator that allows for adjustment of the placement of the component in an accurate manner.

In some embodiments of the invention, the solvent is printed on a top side of the porous substrate and evaporation of the solvent creates a local vapor pressure that releases the component at an appropriate location.

In some embodiments of the invention, an imaging system is used to detect both the component holding parameters, such as placement and rotation, and also the placing parameters, such as placement, rotation, and angle with respect to the surface.

In some embodiments of the invention, after the solvent is printed and the component is released, the solvent continues to evaporate, thereby causing the vacuum force to return to the underside of the substrate for the next component to be picked up.

In some embodiments of the invention, the picking process is performed by holding a large number of components, lifting them a small distance (e.g., a few tens of microns), and then using either a laser or an inkjet print head to release some of the components. The placement process is performed in a full touch manner (i.e., with the picking head touching the receiving substrate) or with the picking head positioned very close to the receiving substrate.

In some embodiments of the invention, the placing process is performed by holding a large number of components and releasing one or more selected ones of the components at a small distance from the placement area (e.g., a few tens of microns).

In some embodiments of the invention, the vacuum chamber is filled with a solvent and the components are held first by a vacuum and then by the solvent that creates a sub-pressure at the attachment points. Using this approach, a laser beam is used for heating and the creation of a solvent bubble directly at the respective release points.

In some embodiments of the invention, the picking substrate is a plate of conductive material to avoid electrostatic forces and includes a coating to keep the solvent inside the chamber.

In some embodiments of the invention, the picking substrate is structured as a negative image of the placing substrate (e.g., the PCB), enabling the placement of a large number of components at the same time. More specifically, variations may exist in the height (i.e., "vertical" elevation) at which components are mounted on the placing substrate (e.g., some components being mounted in a depression, while others being mounted on a protuberance). The "negative image" refers to the picking substrate having a surface contour that is complementary to the surface contour of the placing substrate (e.g., where the placing substrate has a depression, the picking substrate would have a protuberance, and vice versa).

These and other embodiments of the invention are more fully described in association with the drawings below.

BRIEF DESCRIPTION OF THE DRAWINGS

The present invention is illustrated by way of example, and not limitation, in the figures of the accompanying drawings, in which:

FIGS. 5a-5d illustrate steps in the release of the electronic component using an inkjet print head, in accordance with an embodiment of the present invention. In FIG. 5a, the component is taken to the release point. Then, as shown in FIG. 5b, solvent is printed on the top side of the component opposite the receiving substrate. The solvent evaporates, as shown in FIG. 5c, creating pressure on the component, and results in the component's release at an appropriate location, as shown in FIG. 5d.

FIGS. 12a-12d illustrate an example of a pick and place process using the system shown in FIG. 8, in accordance with a further embodiment of the present invention. In FIG. 12a, the components are held by the pick and place head after an initial alignment. As shown in FIG. 12b, all the components are picked together, and, as shown in FIG. 12c, some are released by the laser. Then, as shown in FIG. 12d, all of the remaining components that are still held by the pick and place head are placed on a PCB or other substrate together.

FIGS. 13a-13i illustrate another example of a pick and place process configured in accordance with an embodiment of the present invention in which components are individually picked using an inkjet printhead (FIGS. 13a-13f) and placed concurrently (FIGS. 13g-13i).

FIG. 15a illustrates an example of such a structure made of rubber. FIG.

15b illustrates an example of such a structure made of a hard material that has a rubber coating. FIG. 15c illustrates an example of such a structure that creates high vacuum of the component using a more confined structure (i.e., more confined picking hole).

DETAILED DESCRIPTION

Figure 1:
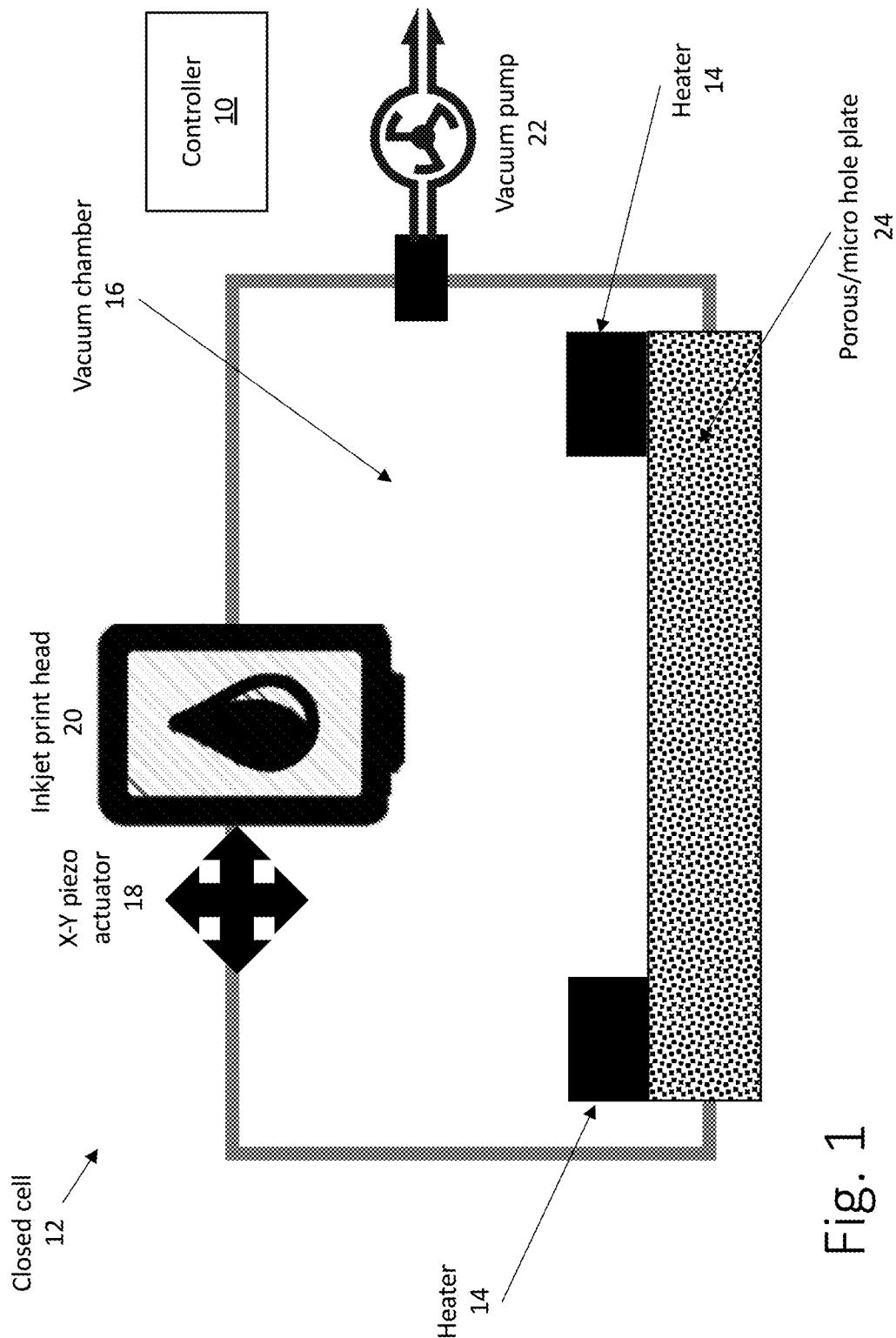
FIG. 1 illustrates a closed cell with a vacuum pump to create a vacuum chamber within the closed call, a porous substrate, and an inkjet print head, in accordance with an embodiment of the present invention.

Before describing the invention in detail, it is helpful to present an overview. A schematic representation of a first embodiment of a system configured for pick and place operations in accordance with the present invention is shown in FIG. 1. A closed cell 12 (also called a vacuum cell) with a bottom formed of a micro hole array or a porous plate 24 is evacuated by a vacuum pump 22, forming a vacuum chamber 16 having a pressure lower than a surrounding atmosphere. This vacuum chamber 16 generates a sub-pressure force on the underside of the micro hole array or a porous plate 24 that is responsible for picking up any electronic component (e.g., a resistor, light emitting diode (LED), integrated circuit (IC), or other electronic device) and each hole in the plate 24, or area in the case of the porous substrate, is a potential picking area for a component.

The cell temperature is governed by one or more heating elements 14 placed in contact with the porous substrate/micro hole array 24 and a sensor (not shown) that, together with a controller 10 maintains the vacuum chamber 16 at the proper operating conditions (e.g., pressure, humidity, and/or temperature). It is important for the temperature of the porous substrate/micro hole array 24 to be controlled as its temperature governs the solvent evaporation in later stages of the pick and place process. The solvent is selected according to a vacuum level and temperature and is one of: water, ethanol, glycol or an organic solvent.

The closed cell 12 also includes an inkjet print head 20 that can print solvent at a very high rate and on-demand on distinct areas of the porous substrate/micro hole array 24 (which will also operate as a release plate). The inkjet print head 20 and the release plate 24 are physically connected and therefore create a very well-defined area where release of components will take place. The inkjet print head 20 may include an X-Y piezo actuator 18 to compensate for small changes in position needed for the printing. Alternatively, the actuator 18 and the inkjet print head 20 may be two distinct components that are mechanically coupled to one another.

Figure 2:
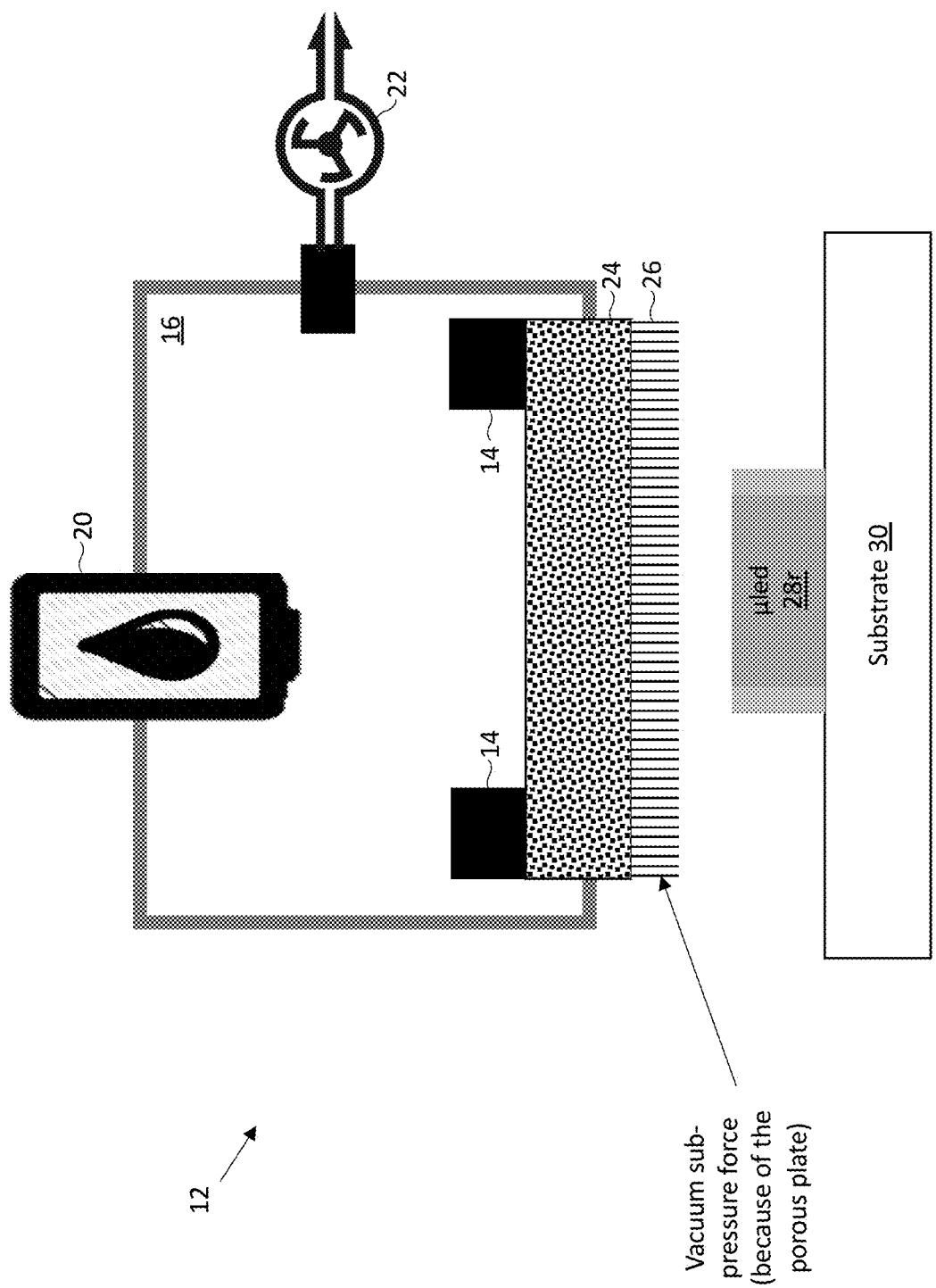
FIGS. 2 and 3 illustrate an example of the picking of an electronic component by a system configured as shown in FIG. 1, in accordance with an embodiment of the present invention.
Figure 3:
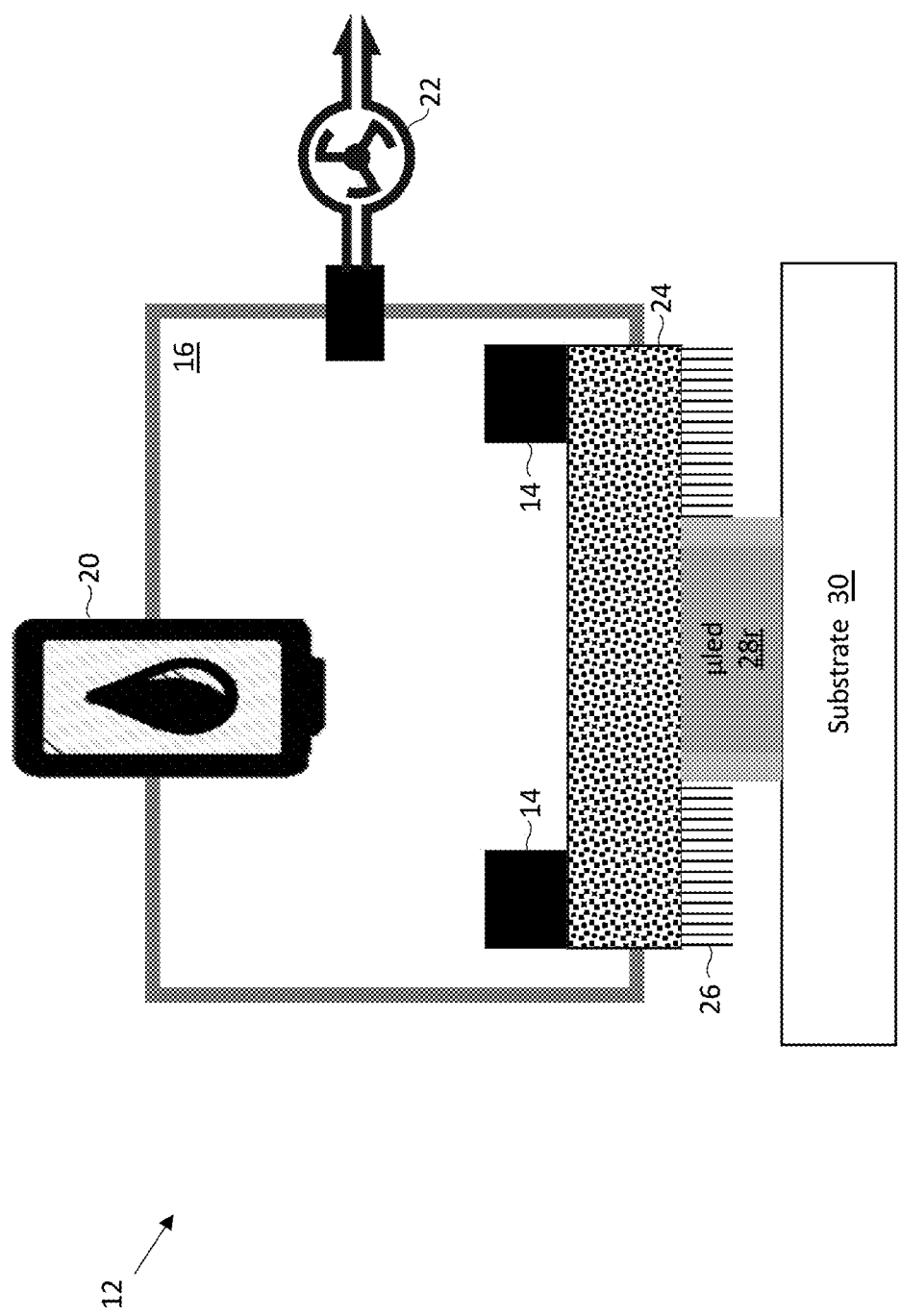

FIGS. 2 and 3 illustrates the "picking" process. Using the vacuum pump 22, a sub-pressure (that is, a pressure lower than the surrounding atmospheric pressure) is developed inside the vacuum chamber 16 before engaging the electronic component (e.g., a red micro LED 28r) and, after the engagement, the sub-pressure is maintained to create a force on the component to complete the picking process. For ease of notation, the letter "r" is used to refer to a red LED, and as shown in the later figures, the label "g" is used to refer to a green LED, and the label "b" is used to refer to a blue LED. Of course, it is understood that techniques of the present invention are applicable to LEDs (and other components) regardless of the specific color of LED. With the sub-pressure in the vacuum chamber 16, the closed cell 12 is lowered over one or more electronic components (e.g., red micro LED 28r) so that the porous substrate/micro hole array 24 makes contact with a surface of the component. Because of the sub-pressure in the vacuum chamber 16, a force 26 is exerted on the component, so that when the vacuum chamber 16 is raised, the component is lifted off of its resting place and maintains contact with the porous substrate/micro hole array 24, as shown in FIG. 4.

Figure 4:
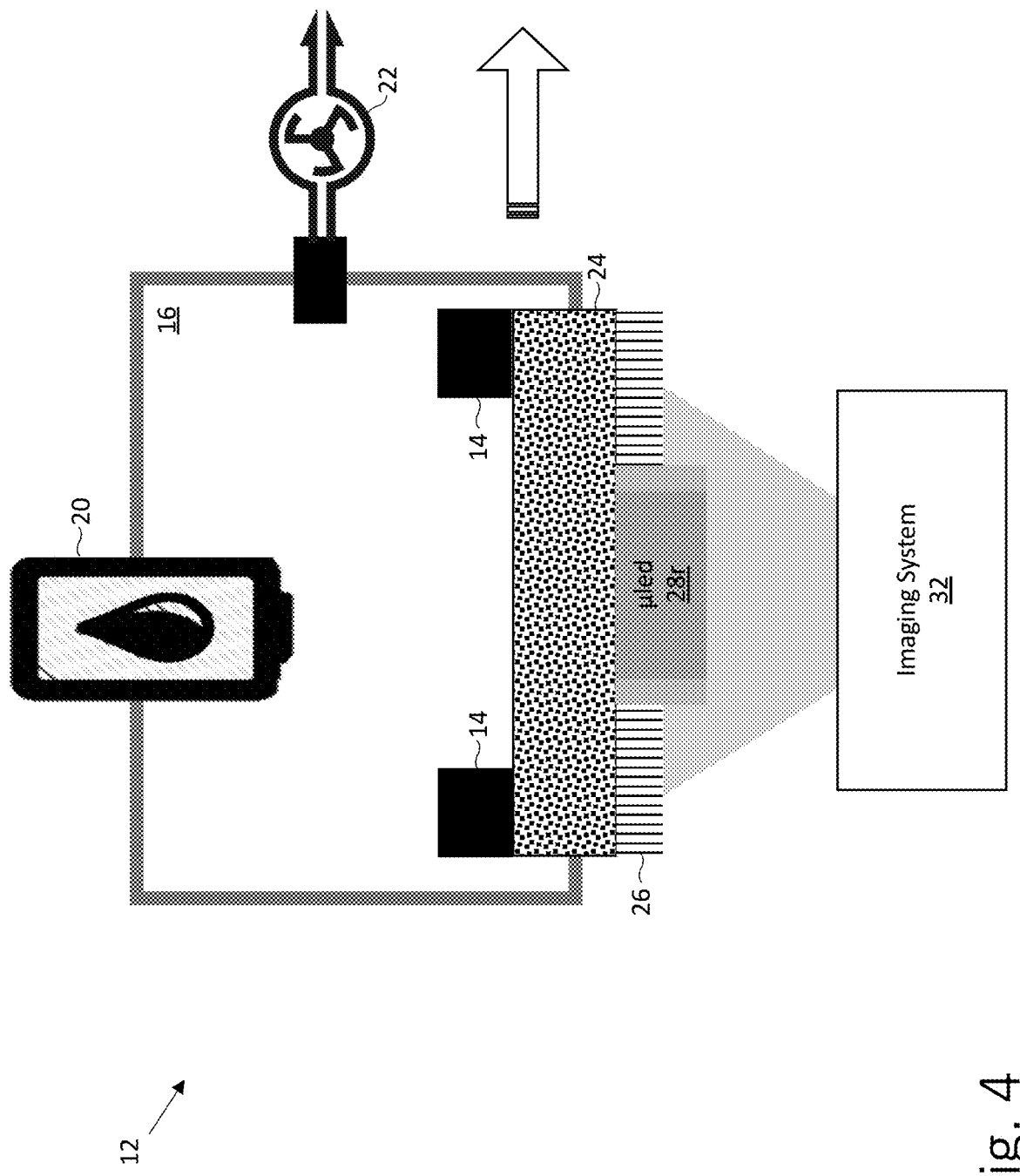
FIG. 4 illustrates aspects of the inspection of the electronic component after being picked up by the system shown in FIG. 1, in accordance with an embodiment of the present invention.

Also, as shown in FIG. 4, after picking the component, an imaging system 32 (e.g., an optical inspection station) is used to image the holding of the component (e.g., red micro LED 28r) so as to assist with the positioning (e.g., centering) of the component with respect to a desired holding point on the porous substrate/micro hole array 24. It is also possible to image the porous substrate/micro hole array 24 prior to the picking of the component (not depicted) so as to determine a suitable holding point for the component on the porous substrate/micro hole array 24. At this stage, the component (e.g., red micro LED 28r) can be released and picked again to adjust its position on the porous substrate/micro hole array 24 and/or to compensate for any undesired orientation of the component, etc.

After picking the component (e.g., red micro LED 28r), the closed cell 12 is moved to the release point proximate the PCB or other receiving substrate 34 (e.g., flat panel display) and the release procedure is started. FIG. 5a shows the vacuum chamber 16 with the picked component (e.g., 28r) arriving at the designated release point (e.g., centered between two connection pads 62). Note, the movement of the vacuum chamber 16 and PCB 34 (or other receiving substrate) is relative to one another and in some cases either or both may move so as to bring them proximate to one another at the release point. In cases where a number of vacuum chambers are used to sequentially pick and place a number of components on the PCB or other receiving substrate 34, a circular or similar track may be used to move the vacuum chambers 16, initial substrates 30 on which the components are located, optical inspection stations 32, and PCB/receiving substrate 34 relative to one another so that while one chamber is placing a component, another may be having its just-picked component inspected, and a third is in the process of picking a component from the initial substrate 30.

Now referring to FIG. 5b, with the vacuum chamber 16 positioned at the release point (which positioning may be coordinated using another optical monitoring system), the inkjet print head 20 may print a solvent 36 directly on top of the porous substrate/micro hole array 24 (i.e., the release substrate) at a location opposite the electronic component (e.g., 28r). The cell temperature is controlled at this point to ensure the solvent 36 reaching the surface of the porous substrate/micro hole array 24 before evaporating and a pressure being built on the surface of the release substrate 24.

Referring to FIG. 5c, when the solvent 36 reaches the release substrate 24, the solvent 36 starts evaporating, creating an overall force in all directions because of the change in the entropy of the solvent 36. The change is based on the volume change from the liquid to the gas phase and creates an increase in the volume that produces a pressure and a force opposite to the holding force of the vacuum. A fast change in the force balance leads to a decoupling between the cell (i.e., the release substrate 24) and the electronic component (e.g., 28r), causing the component to be released. The cell temperature continues to be controlled, making sure all the solvent is evaporated and that the release area is free and open (the evaporation process shown in FIG. 5d) for the picking of the next component.

The release conditions are based on the solvent type and, mostly, on its evaporation rate. The inkjet print head 20 can change the droplet size, momentum, and the number of droplets used at each point. All of these variables, along with the cell temperature that is governed by the heating elements, will affect the conditions of component release.

Figure 6:
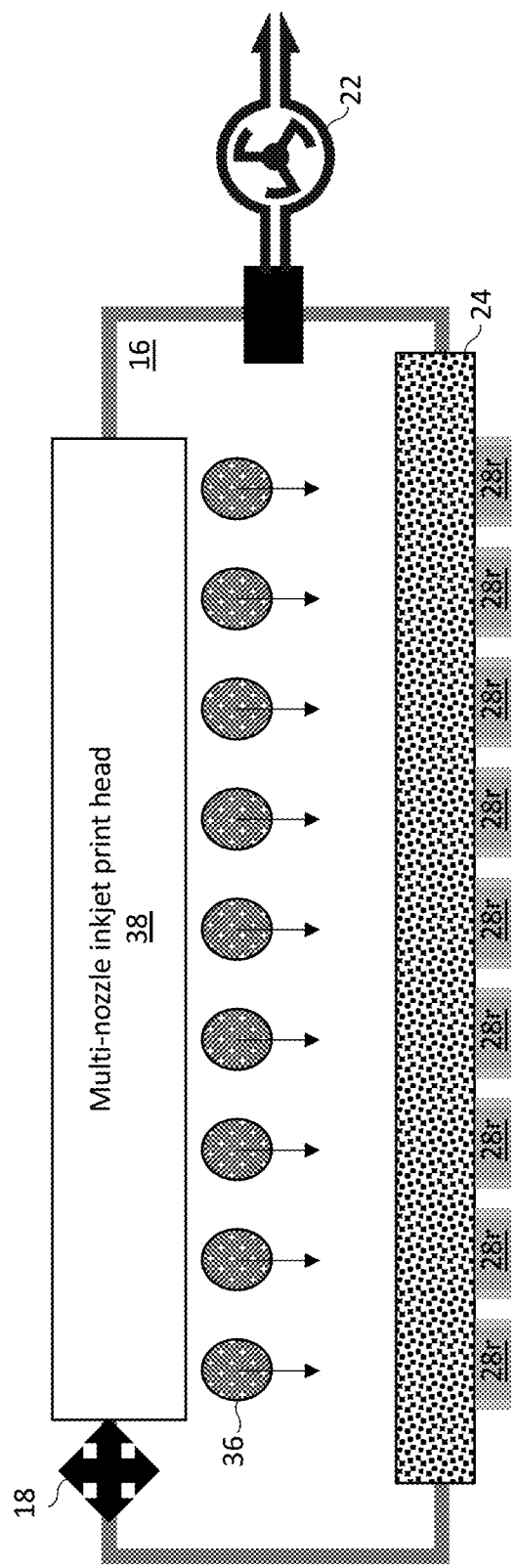
FIG. 6 illustrates a multiple-nozzle inkjet print head that can release many components simultaneously, in accordance with an embodiment of the present invention.

Commercially available inkjet printings heads, for example as developed by XAAR®, Fugi, and others, may be used with vacuum chambers as described herein. These inkjet print heads have multiple nozzles that can print at very high rates and from several nozzles simultaneously. The number of nozzles and the distance between the nozzles, as well as the size of the electronic component that is placed on the PCB, will affect the overall rate of components placement. An example of a multiple nozzle inkjet print head 38 is illustrated at FIG. 6. In a multiple nozzle inkjet print head 38, one or drops of solvent 36 may be simultaneously dispensed by the print head 38 to release one or more electronic components (e.g., 28r) from the release substrate 24.

Figure 7:
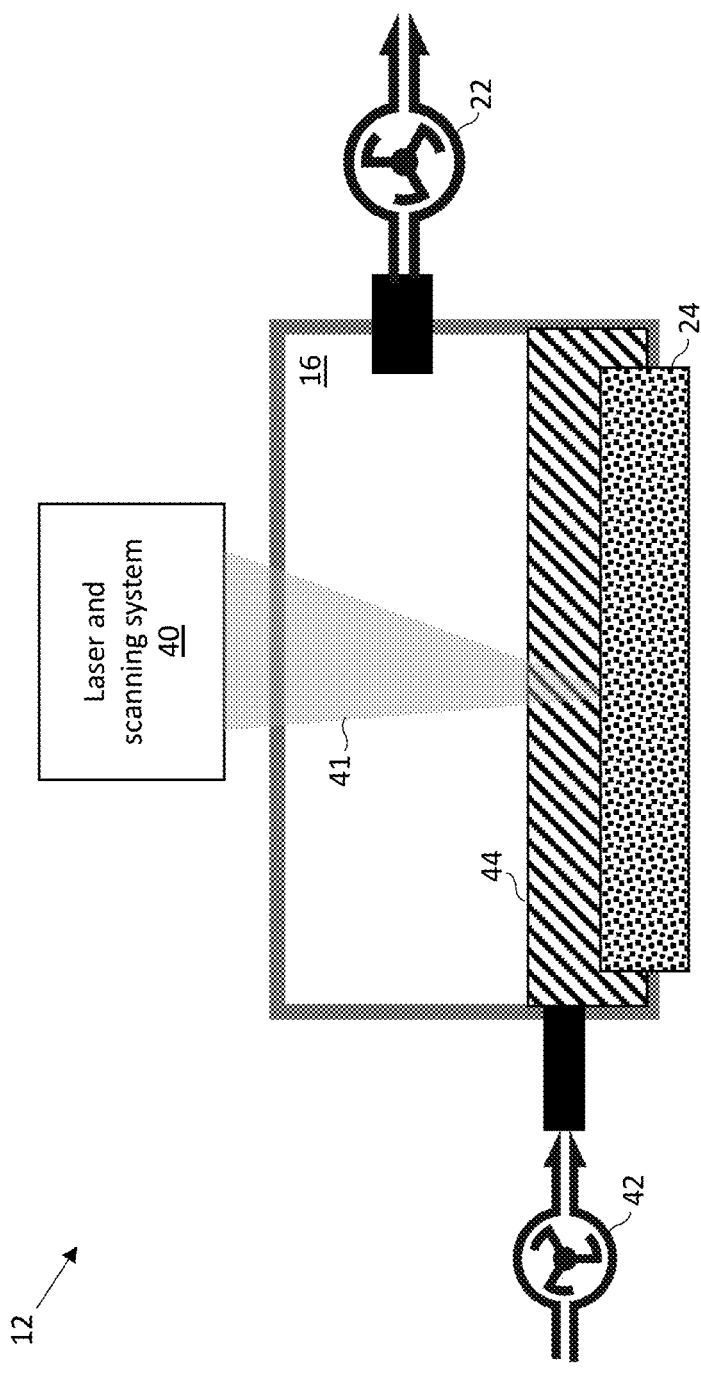
FIG. 7 illustrates a closed cell with a vacuum pump to create a vacuum chamber, a porous substrate, and a laser print head that is used to release components, in accordance with a further embodiment of the present invention.

FIG. 7 illustrates an alternative embodiment of the present invention that affords, in some cases, an even faster process for the placement of electronic components. As shown in the illustrated embodiment, the inkjet print head is replaced by a laser system 40 (e.g., laser and scanning system). The laser system 40 employs a laser beam 41 that, when activated, heats the solvent 44 on the vacuum chamber-facing surface of the porous substrate/micro hole array locally and creates a high-pressure force directed toward the component. This system needs to have a solvent available for the laser during the heating and therefore a solvent is added to the cell (e.g., by solvent pump 42) and a partial vacuum (e.g., by vacuum pump 22) is applied to the cell 12 to ensure that the solvent does not leak out of the cell 12.

Using this approach, the heating is controlled by the laser power and the pressure is proportional directly to the energy of the laser 41. The momentum and speed of the pressure build up can also be controlled, and the component release can be very accurate. Another advantage of this approach is that the vacuum chamber 16 can be made very small. Consequently, the laser head 40 does not need to be moved as in the first approach of FIG. 1; that is, the laser head 40 can be static and the position of the laser beam 41 can be controlled using optical components (e.g., a scanning mirror, etc.). The upper part of the cell 12 needs to be transparent or nearly so (at least at the wavelength of the laser beam) for the laser 41 to propagate through the top of the cell 12, but there is no need to have a direct connection between the laser system 40 and the cell 12. That is, the laser system 40 may be displaced from the cell 12, as shown. This way, the speed of picking up components and placing components is completely not conjugated, creating an opportunity to pick components and place components at different rates and making it possible to work at the highest rate between those two rates. It is possible to perform each pick operation very slowly (but perform many pick operations in parallel) and to perform the place operation very quickly. Importantly, the laser head 40 is used, in this embodiment, as a heating device to build a desired pressure at a desired location. Alternative approaches can be used, for example, using an LED array instead of a laser head. The output of the LED array can be very intense and can create sufficient energy at each point to build up the desired solvent pressure. The use of an LED array in lieu of a laser head provides the advantage of making the head a very robust and reproducible component, which is less prone to damage than a laser head; an important advantage for industrial production.

Figure 8:
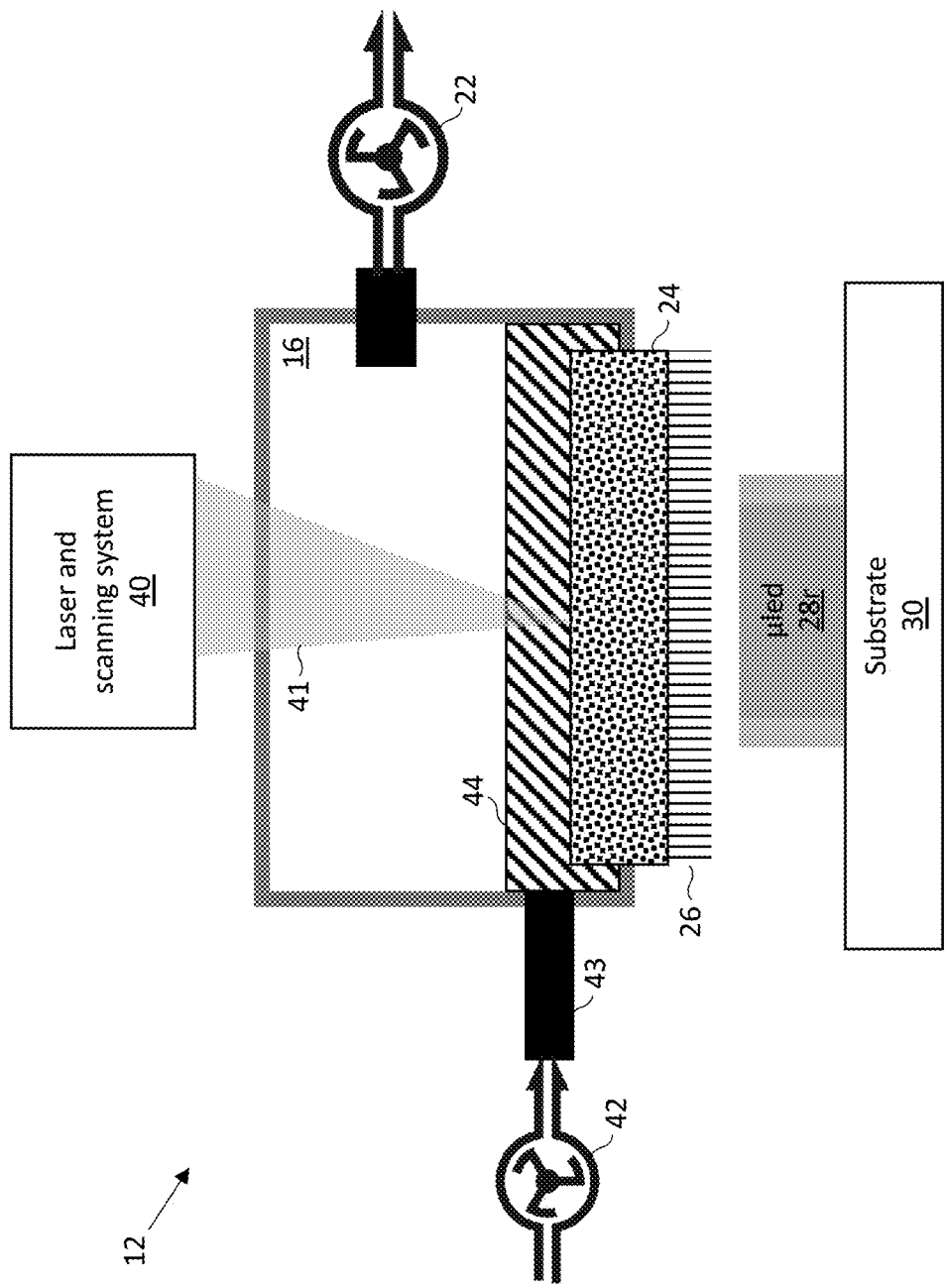
FIG. 8 illustrates variations in the first step of component picking (or mounting) as compared to the inkjet system of FIG. 1, in accordance with a further embodiment of the present invention. In the variation, the vacuum chamber is partially filled with a solvent.

Referring to FIG. 8, the laser-based system is configured so that the laser beam 41 scans the porous substrate 24 and creates a solvent evaporation local pressure at distinct points. The same is true for a micro hole array substrate 24, where the laser beam 41 heats the hole area, creating vapor pressure directly on top on the electronic component (e.g., 28r). This system also has a solvent inlet 43 to make sure the cell 12 is always under some hydraulic attractive force. The vacuum in the chamber 16 creates a sub-pressure and solvent bubbles through the holes before the component (e.g., 28r) is contacted to the hole or porous area. Immediately after contact, an area within the release substrate 24 is sealed by the solvent 44 from one side and the component (e.g., 28r) from the other side, creating a small but permanent attractive force between the two sides.

Figure 9:
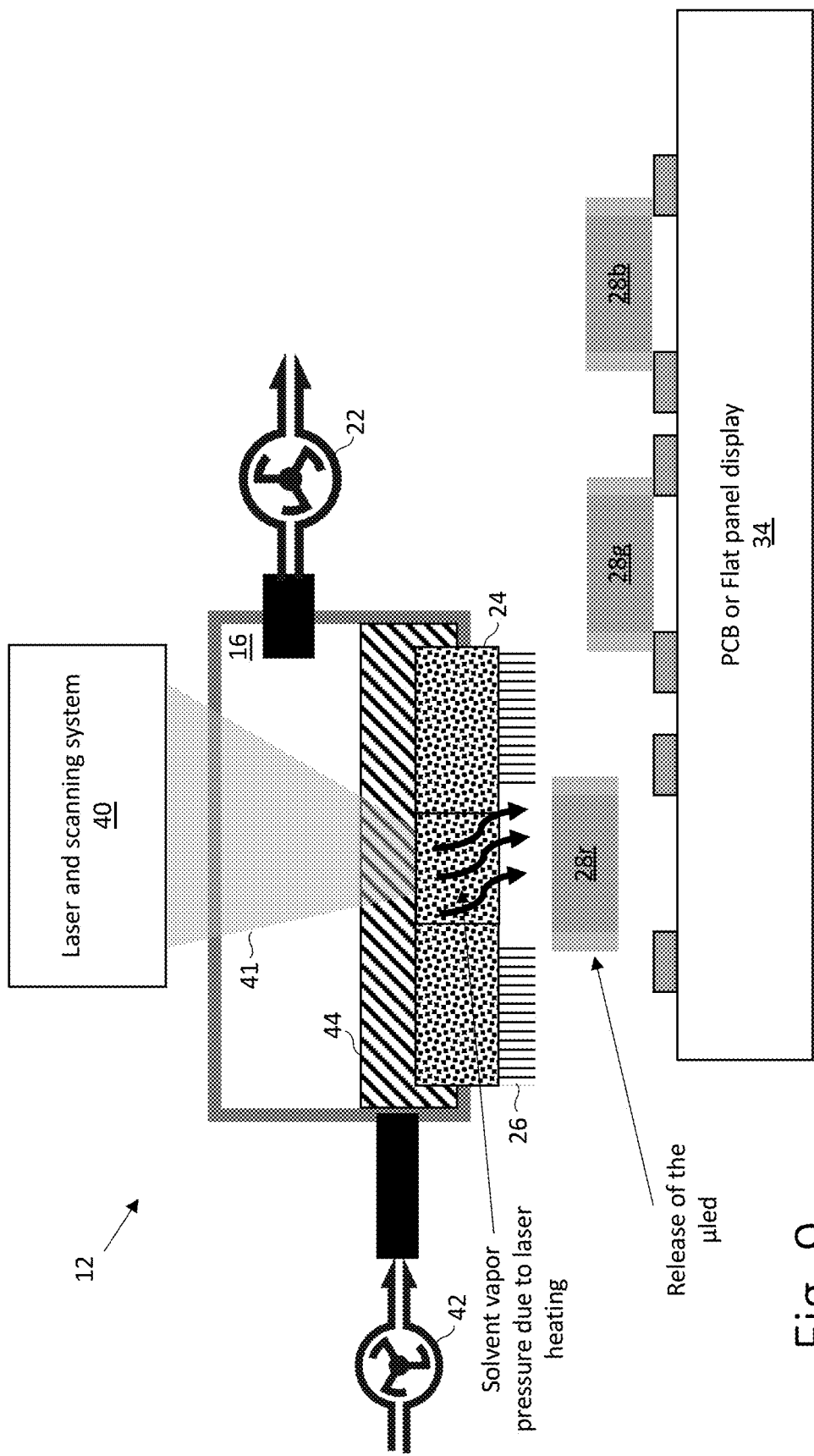
FIG. 9 illustrates aspects of laser scanning and its effect on solvent evaporation, in accordance with a further embodiment of the present invention.

As shown in FIG. 9, this attractive force is released by the laser energy (from laser beam 41) that locally changes the solvent phase and creates a pressure in the direction opposite to the force 26 created by the vacuum, thereby releasing the component (e.g., 28r).

Figure 10:
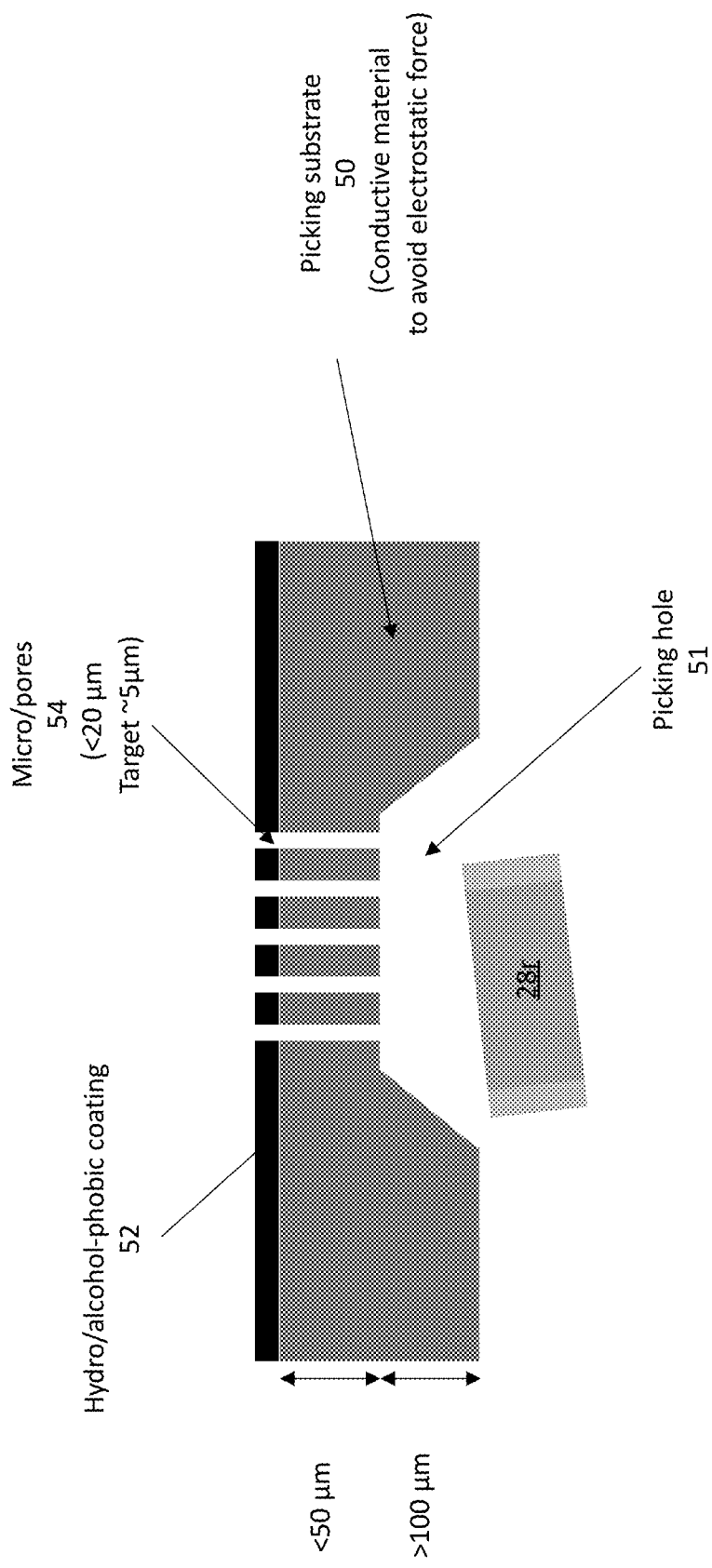
FIG. 10 illustrates an example of a micro hole plate with small tunnels, a hydrophobic coating, and a holder structure that reduces electrostatic forces and guides the component into place, in accordance with a further embodiment of the present invention.

Referring to FIG. 10, whether for use with the inkjet print head 20 or laser system 40, the micro hole array or porous substrate 50 can be structured in such a way that a component will be aligned to the placement area. For example, by chamfering the areas of the micro hole array or porous substrate 50, an electronic component (e.g., 28r) can be made to self-align within an area (e.g., picking hole 51) of the micro hole array or porous substrate 50 corresponding to a desired release area when picked (e.g., by beveling the sides of the area so that the component is guided to a central, planar portion thereof). The micro hole array or porous substrate 50 can also be coated by a hydrophobic or other coating to prevent the solvent from penetrating through the micro hole array or porous substrate 50. Micro hole array or porous substrate 50 can also be structured by a material or a coating that reduces electrostatic forces on the component. Micro hole array or porous substrate 50 can contain micro holes or pores 54 as small as 5 microns or less, creating only a small tunnel for the gas from outside of the vacuum chamber to move through the micro hole array or porous substrate 50 and into the vacuum chamber.

Figure 11:
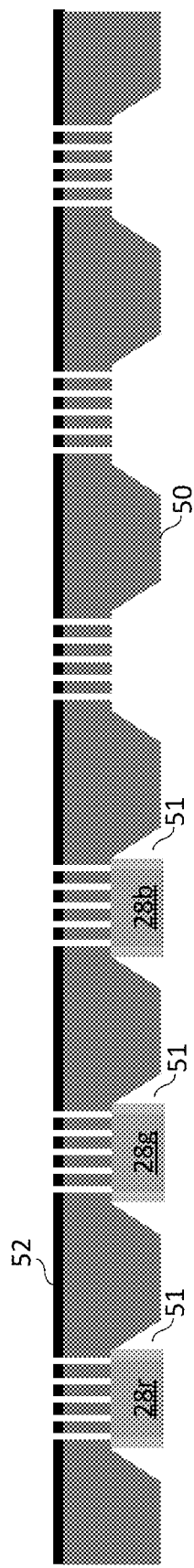
FIG. 11 illustrates aspects of mounting multiple electronic components at the same time using a system as shown in FIG. 1 or 8, in accordance with a further embodiment of the present invention.

The same substrate can be used to pick and deliver several types of components as shown in FIG. 11, where 3 different types of components (e.g., LEDs) are held by the same structure. In FIG. 11, a red micro LED 28r, a green micro LED 28g and a blue micro LED 28b are located in respective picking holes 51.

One example of a very efficient pick and place process is shown in FIGS. 12a-12d. Using this approach, all the picking holes in the picking substrate 50 are filled with components (e.g., red micro LEDs 28r) through application of a vacuum created by vacuum pump 22 (not shown in FIGS. 12a-12d). The components 28r could come arranged in an ordered plate (i.e., a plate provided by the manufacturer of the components on which the components are arranged in an ordered manner, e.g., by color, size, shape, etc.), and therefore would be accurately attached to the holes or could be ordered by other means such as an acoustic device. The components could also be ordered by the structure of the holding plate, especially in the case where variation in the respective heights of the components exists. Regardless, the picking process is very fast and accurate and all the components may be picked at the same time (see FIG. 12a).

Figure 12A:
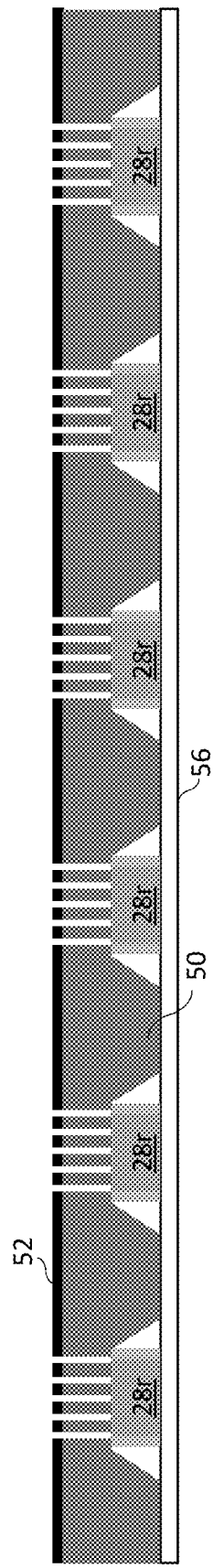
Figure 12B:
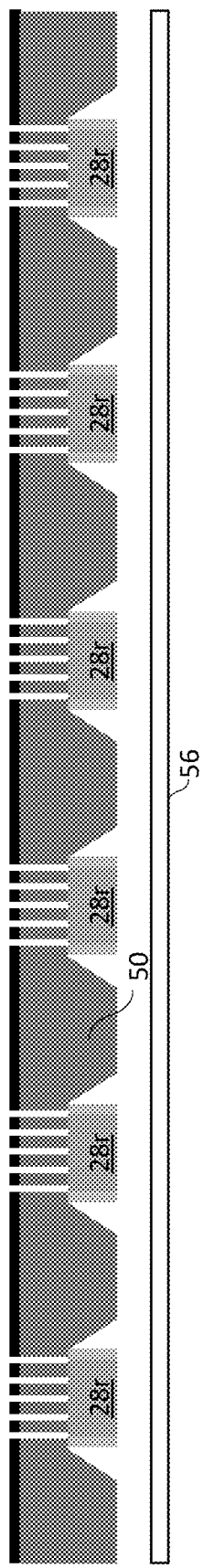
Figure 12C:
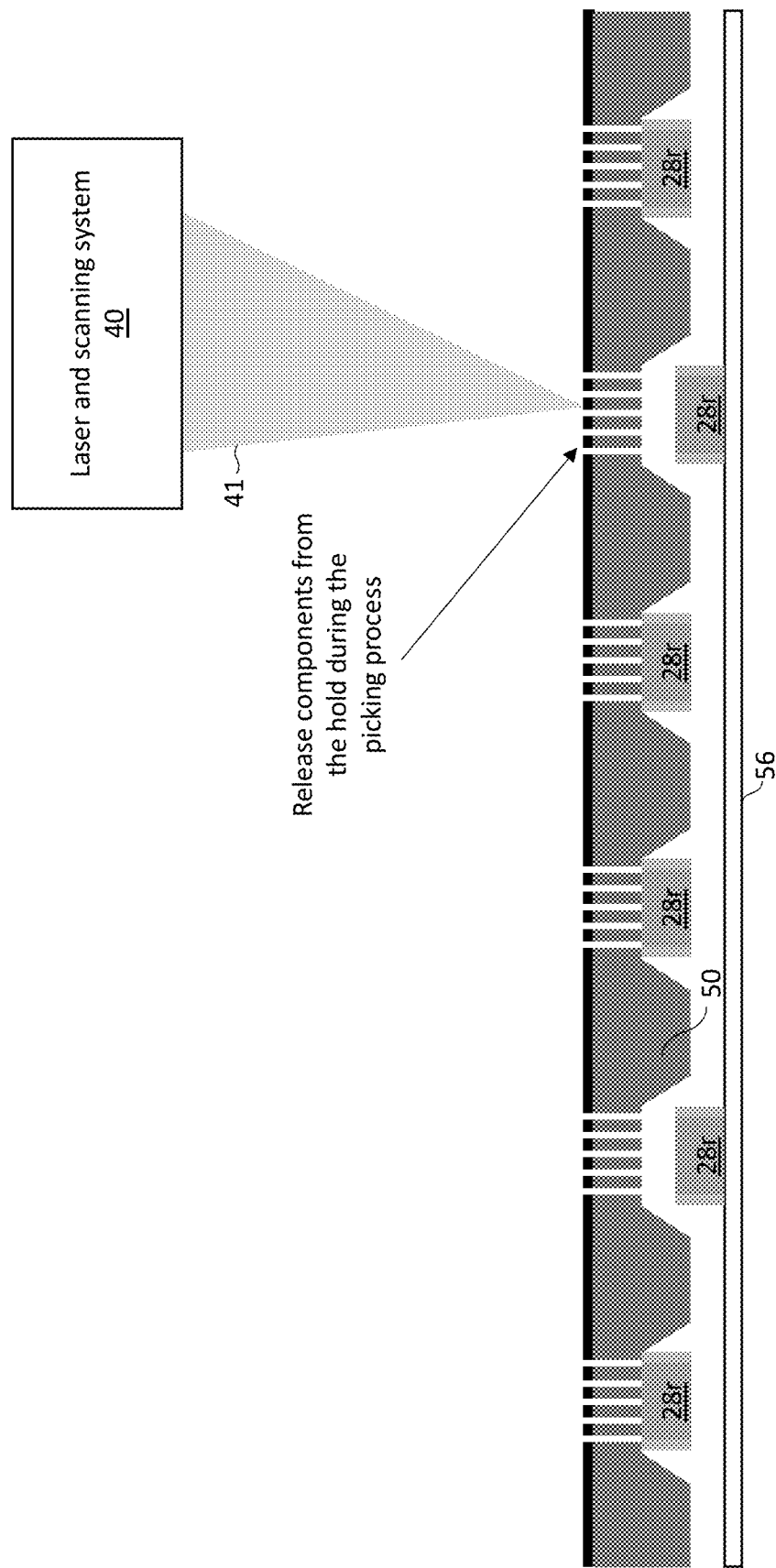

Next, referring to FIG. 12b, the components 28r are held in close vicinity (e.g., a few microns to a few tens of microns) to the providing substrate 56, but so as not to contact the providing substrate 56. In one embodiment, a 5-50 micron distance is sufficient. At this stage, as depicted in FIG. 12c, a laser beam 41 is used to heat holes corresponding to areas of the release plate 50 that hold components that are not desired for placing on the receiving substrate or PCB, thereby releasing the not desired components back to the picking area. In this way, the picking is very fast and accurate and is not connected to the placing process. The components can be picked up several times by several holding plates until they are destined to be placed. The placing process is very quick and is performed with the components (e.g., 28r) in direct contact with the PCB 58, reducing the placement error close to zero (see FIG. 12d).

Although not shown in the illustrations, in various embodiments a moveable arm may be employed to move the electronic components from one site to another, e.g., to arrange them for picking. Further, means for translating the vacuum chamber and/or receiving substrate with respect to one another (e.g., a moveable arm, track system, etc.) may be employed so as to move the components attached to the vacuum chamber into position for placement. Such operations may be performed under the control of a controller 10 that is configured (e.g., under software control) to effect the processes described above.

Referring now to FIGS. 13a-13i, another example of a pick and place process and apparatus configured in accordance with embodiments of the present invention is shown. In this approach, the pick process is repeated several times for different components and the place process is performed only once for all picked components. This approach provides the advantage of speed inasmuch as the placing operation to assemble the final product (e.g., a PCB with mounted components) can be produced in a single step and the picking process can be performed simultaneously across several production lines, increasing the production efficiency dramatically. Beginning with FIG. 13a, a picking head 53 that includes a multi-nozzle inkjet print head 38 and is configured for the pick and place process is shown. The picking head 53 can be manipulated (e.g., by a three-axis controller 18) in the X-Y-Z directions and the inkjet print head 38 therein is operated to print dots of materials adjacent to various picking holes 51 of the picking head 53. Vacuum (created by vacuum pump 22) is then applied to the picking head 53 to enable pickup of components through the unobstructed picking holes 51.

Figure 13A:
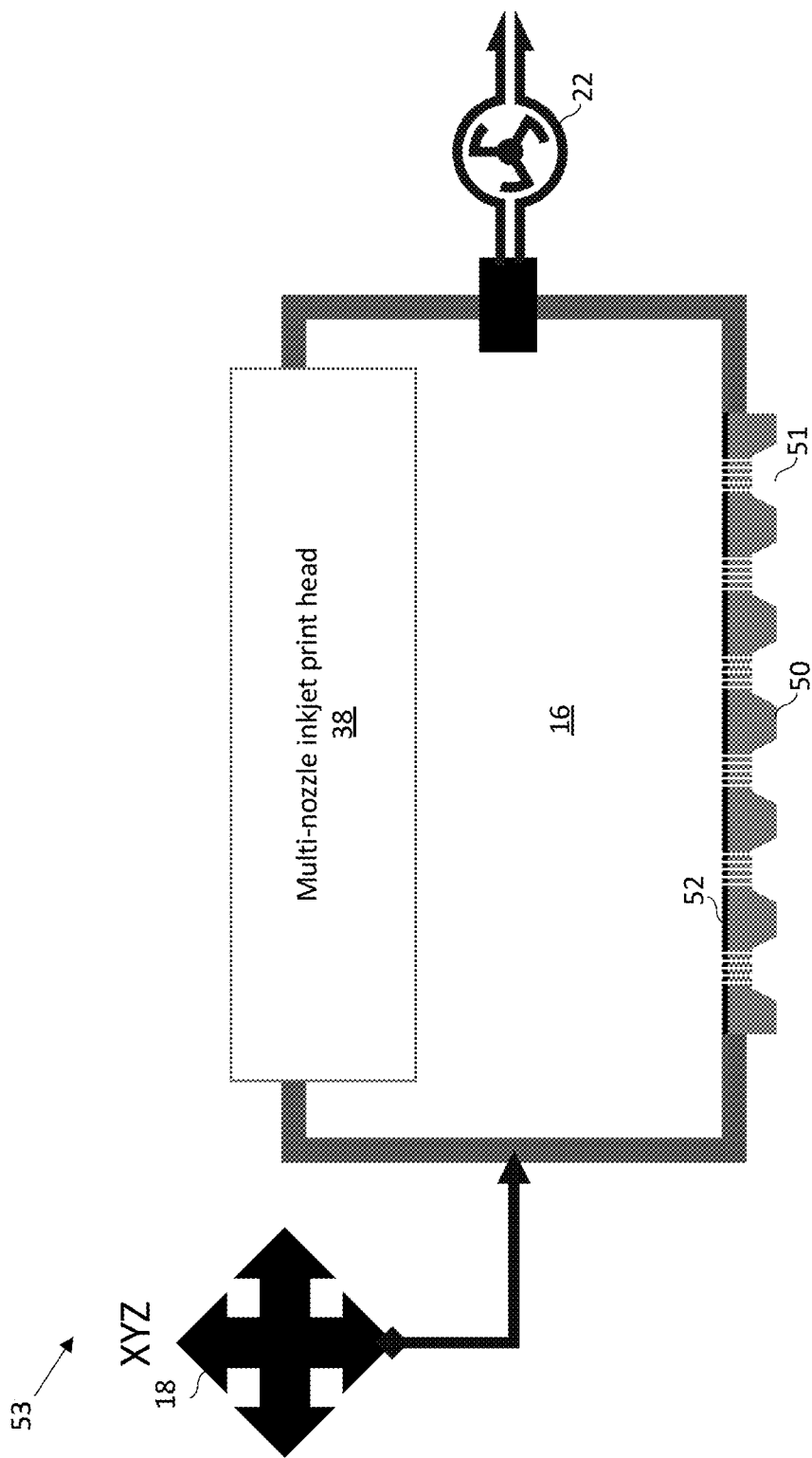
Figure 13B:
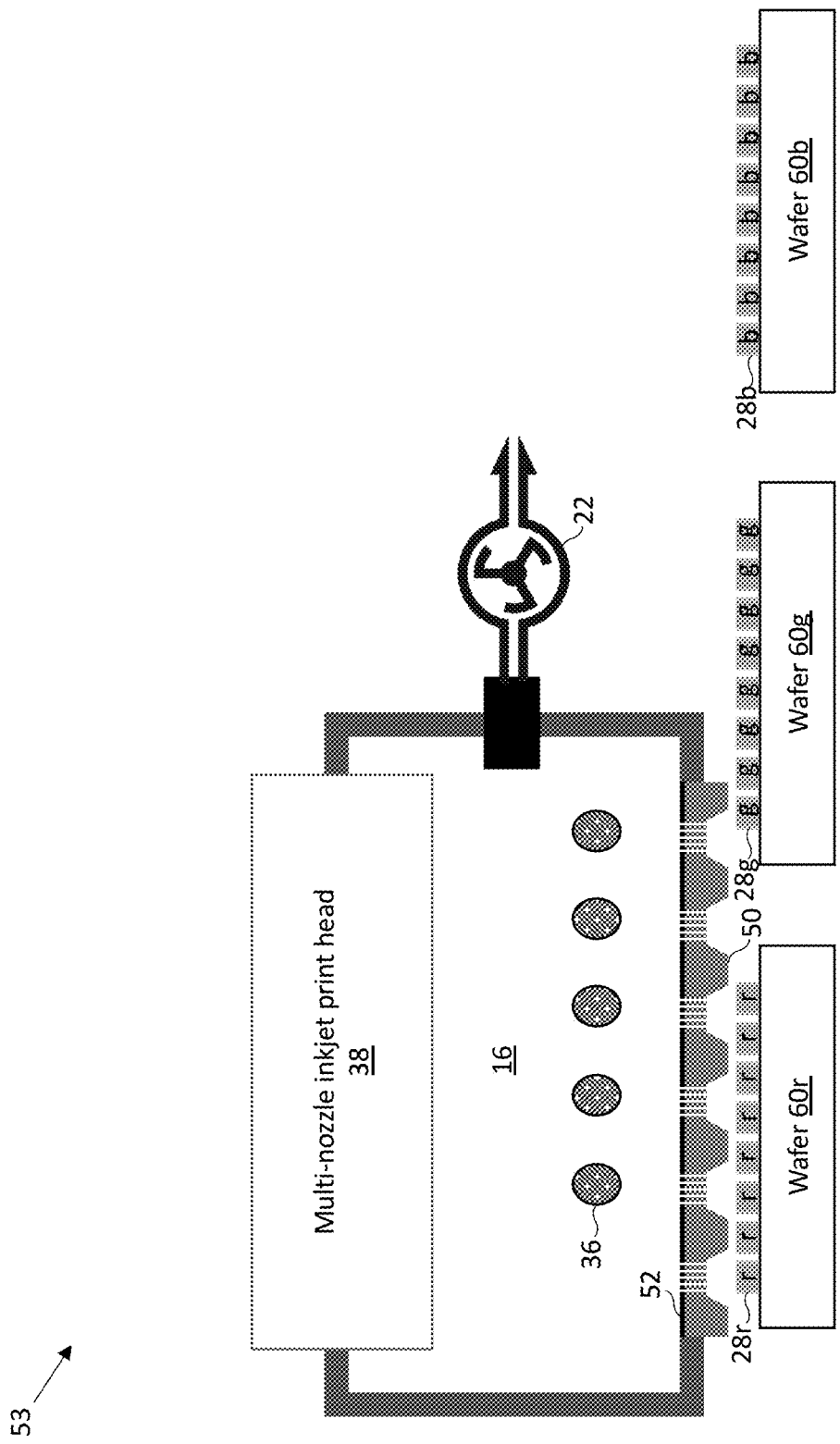
Figure 13C:
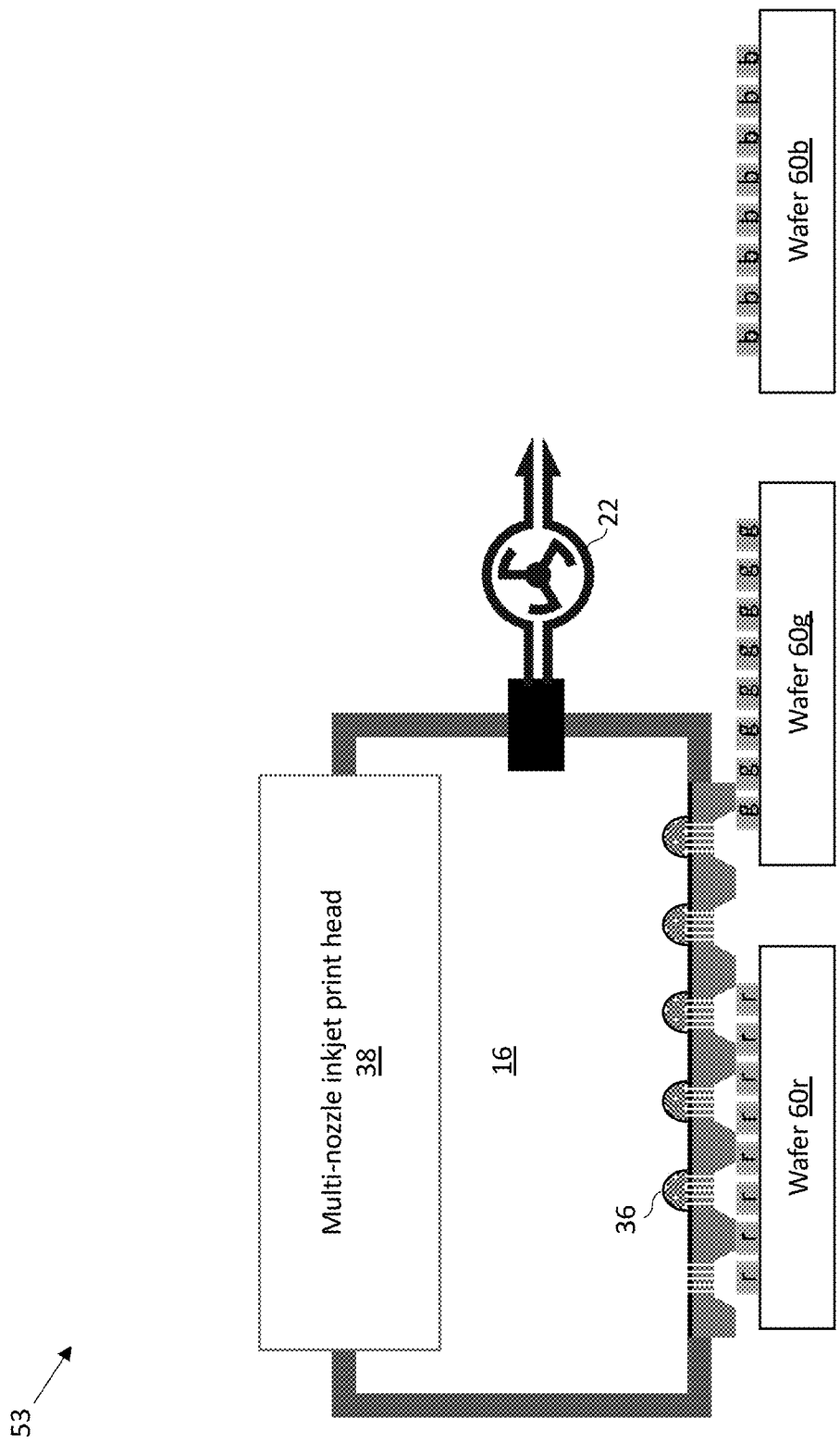

Referring to FIG. 13b, in an initial step the inkjet print head 38 is used to print dots of liquid material 36 above picking holes of the picking head 53 that will, at least for the moment, not be used for picking components. The liquid dots 36 close these holes (completely or at least partially), preventing the vacuum from acting in these locations. In essence, by printing the dots of liquid material 36 at desired locations in the picking head 53, the picking ability of the picking head 53 at these locations is disabled. FIG. 13c illustrates the picking head 53 after the liquid dots 36 has been printed adjacent to some of the picking holes.

Figure 13D:
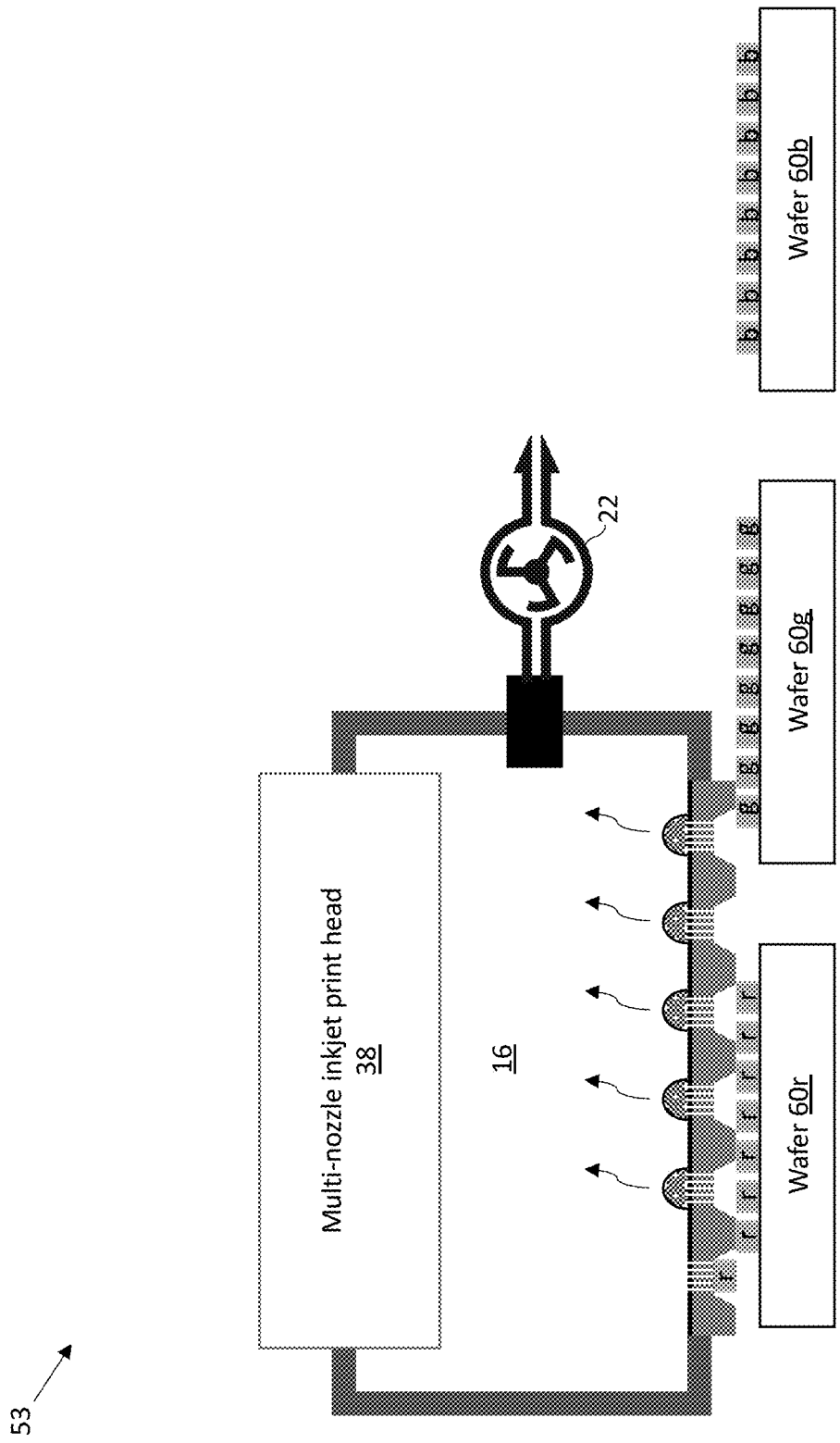
Figure 13E:
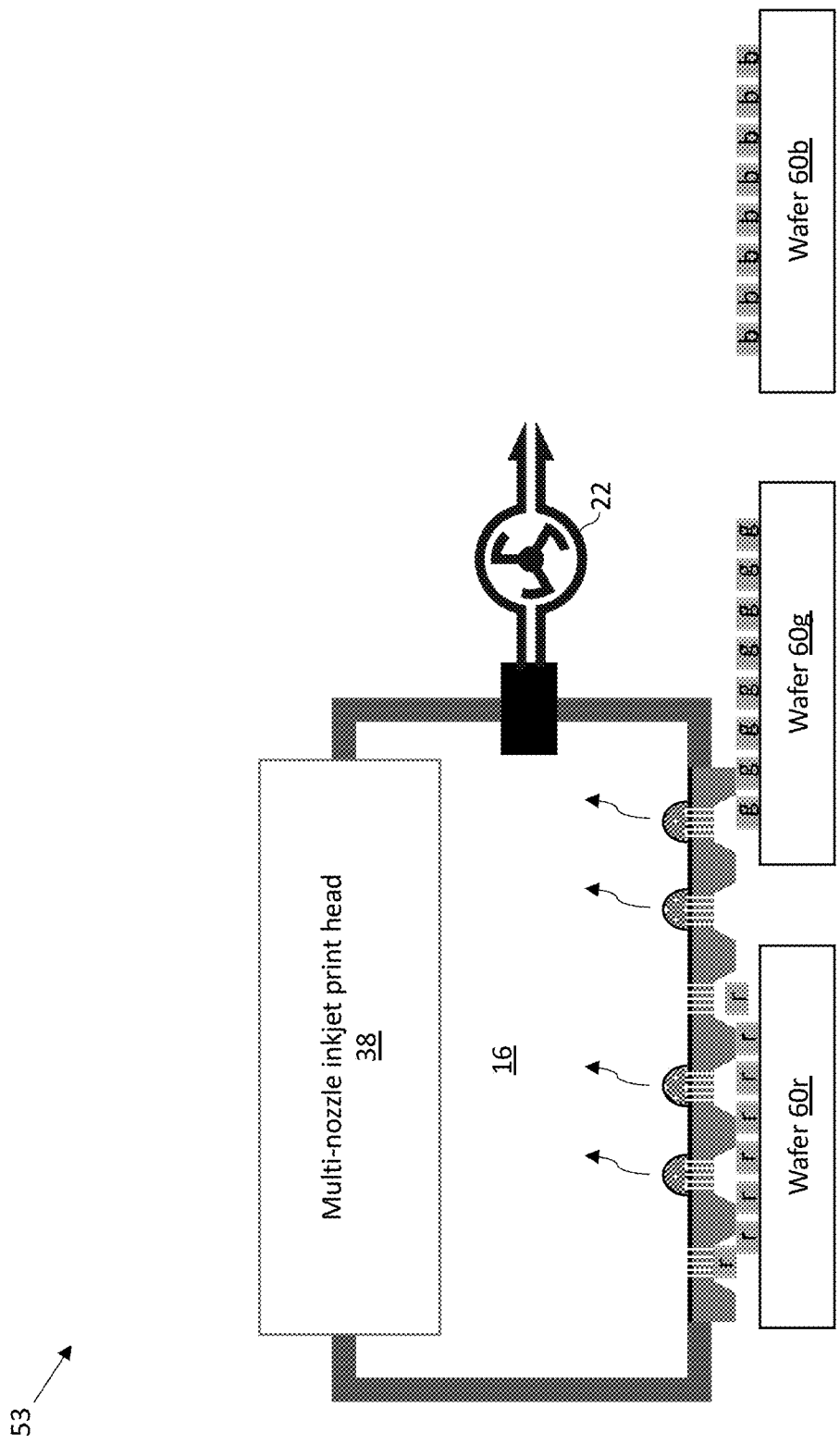
Figure 13F:
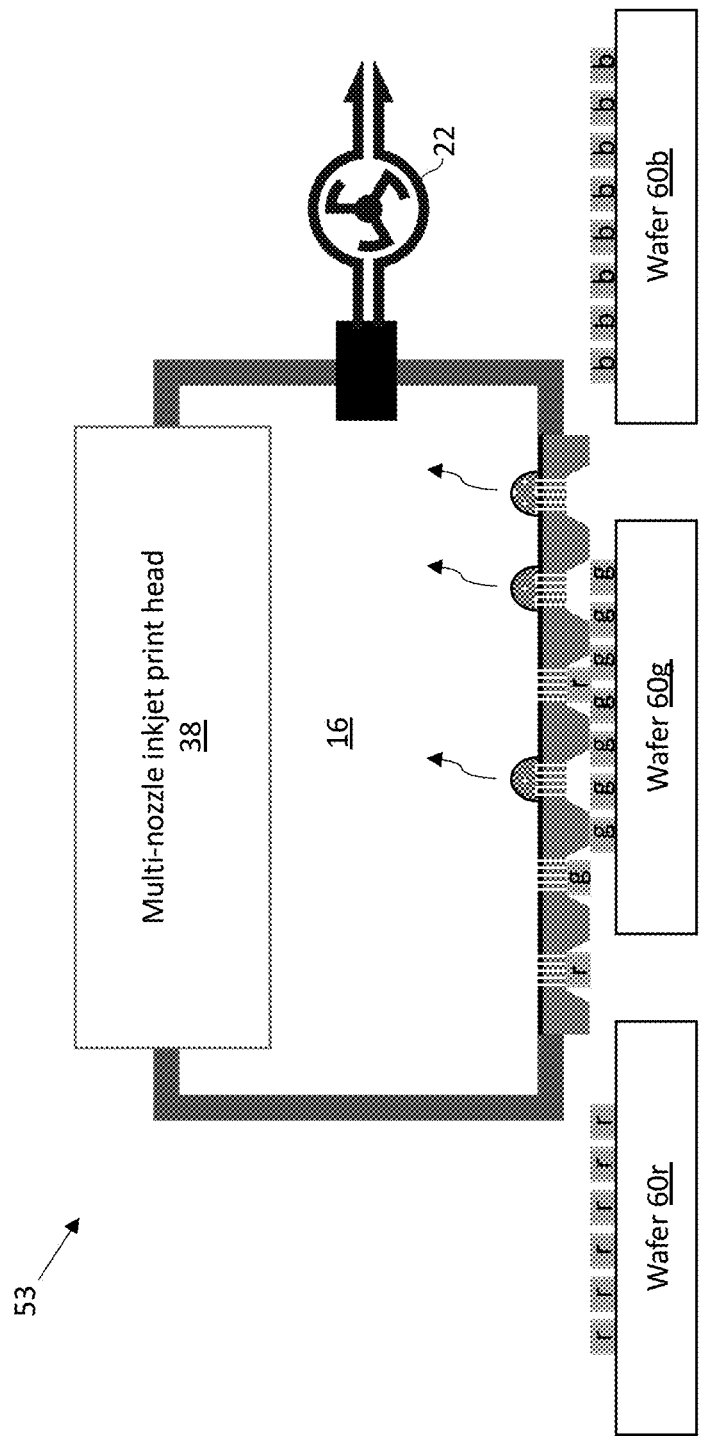

Next, as shown in FIG. 13d, vacuum is applied but only those components that are disposed under exposed picking holes of the picking head 53 are captured by the picking head 53. Those components that are disposed under closed (disabled) picking holes of the picking head 53 are not captured. As shown in FIG. 13e, this process can be repeated several times, perhaps with different ones of the picking holes being disabled, to ensure all the desired components are picked and captured by the picking head 53. Further, as illustrated in FIG. 13f, after picking one type of component from one donor area (e.g., wafer 60r), the process can be repeated for different types of components picked from different donor areas (e.g., wafers 60g, 60b), creating a full array of components captured by the picking head 53.

This approach is very attractive for creating an array of components on one picking substrate (or head) where all the components are of equal size and dimensions but where they differ in some other way. For instance, consider an LED array destined for display screens where each pixel is composed of three LEDs, each of a different color. For such an application, the components are typically already arranged in an ordered array and the picking substrate can be designed very accurately for the picking process prior to screen production. This approach can also be used also for components that have different dimensions (e.g., different heights) by adjusting the picking substrate structure to compensate for such differences. It is also possible to use mechanical means (e.g., a motorized arm or similar mechanism) to order the components prior to picking. Such ordering is typically a slow and perhaps inefficient process, but is typically performed outside of the main production line (not in the critical route for production). Alternatively, a more sophisticated of ordering the components may be employed, for example using an ultrasonic transducer with accurate frequencies to align the components in the correct places.

Figure 13G:
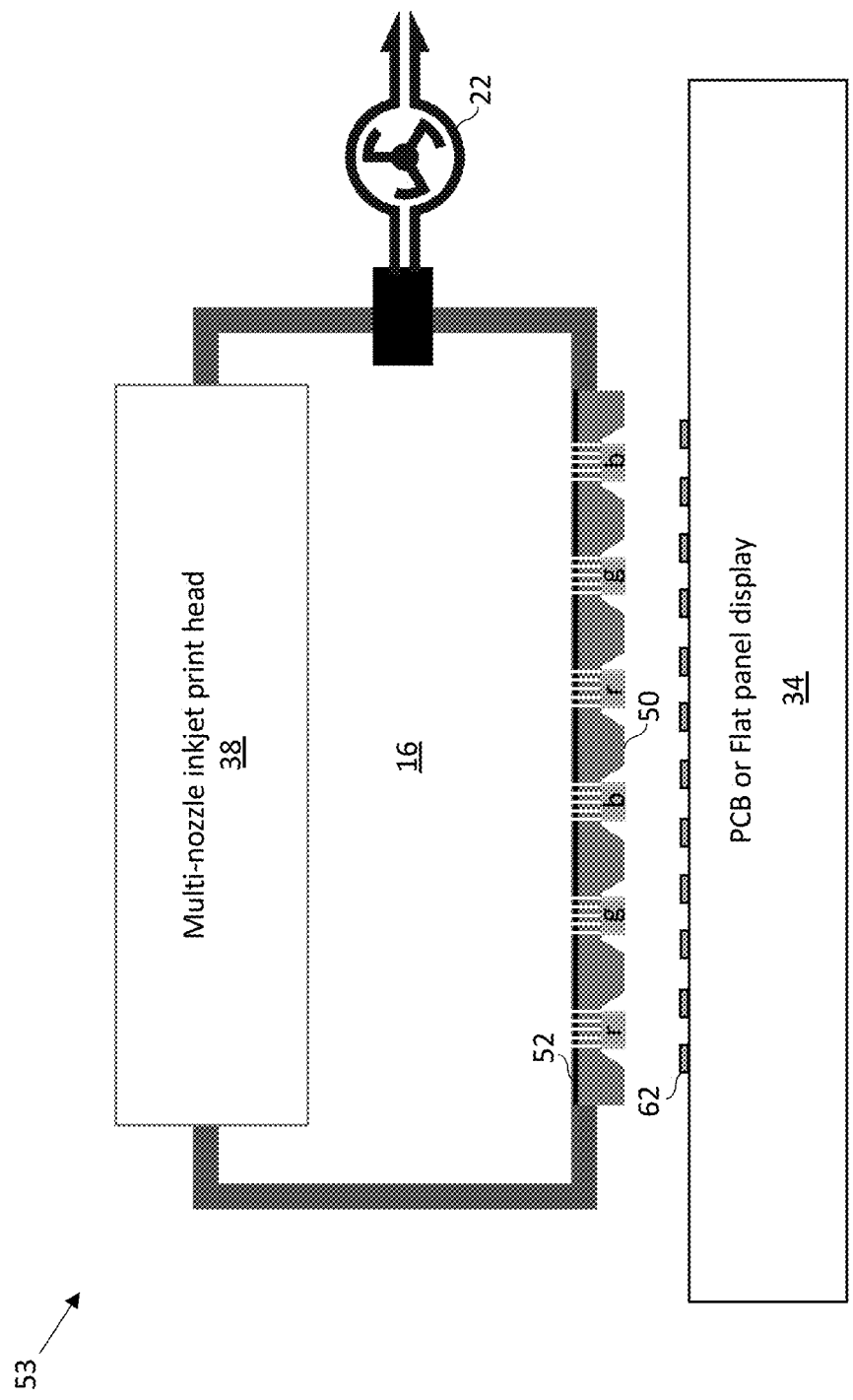
Figure 13I:
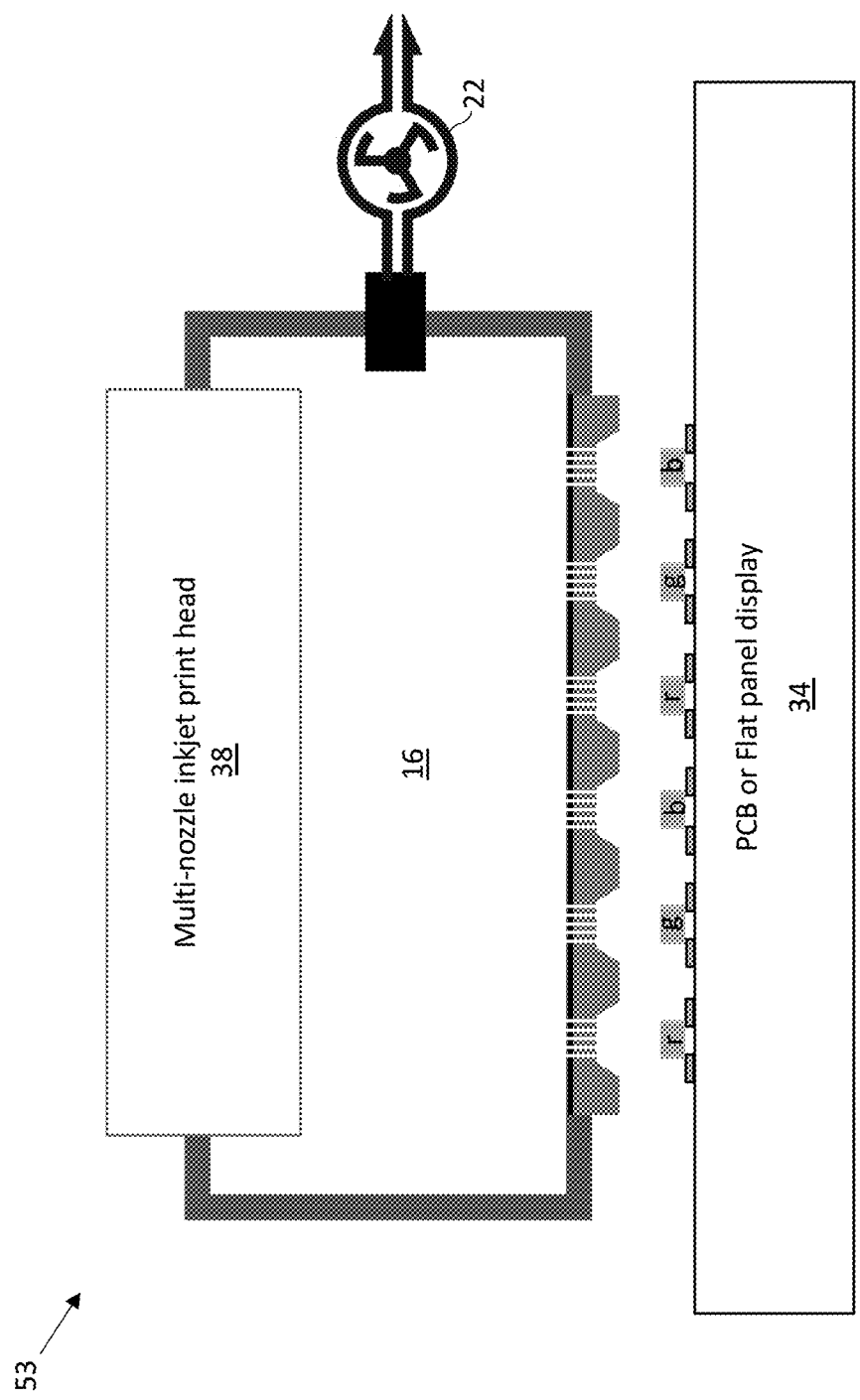

After the picking process has been completed, the full picking substrate 50 with all the picked components ready for placement is transported (e.g., by a tracked translation system, a motorized multi-axis arm, or other means) to the placing position (see FIG. 13g). The picking substrate 50 may be positioned accurately over the receiving substrate 34 (e.g., a PCB, flat panel display, etc.) with or without the aid of fiducials and then the vacuum is released, causing the components to be deposited in the required respective positions on the receiving substrate 34 (see FIGS. 13h and 13i). In various embodiments, the positioning of the picking substrate 50 and receiving substrate 34 may involve movement of either or both components and may be monitored using an optical or other electromagnetic arrangement to provide feedback on the positioning process. Additionally, when the components are released, a slight overpressure in the picking head may be applied (e.g., through reversal of the vacuum pump 22 or operation of a second air pump) so as to ensure their separation from the picking head 53.

Figure 14A:
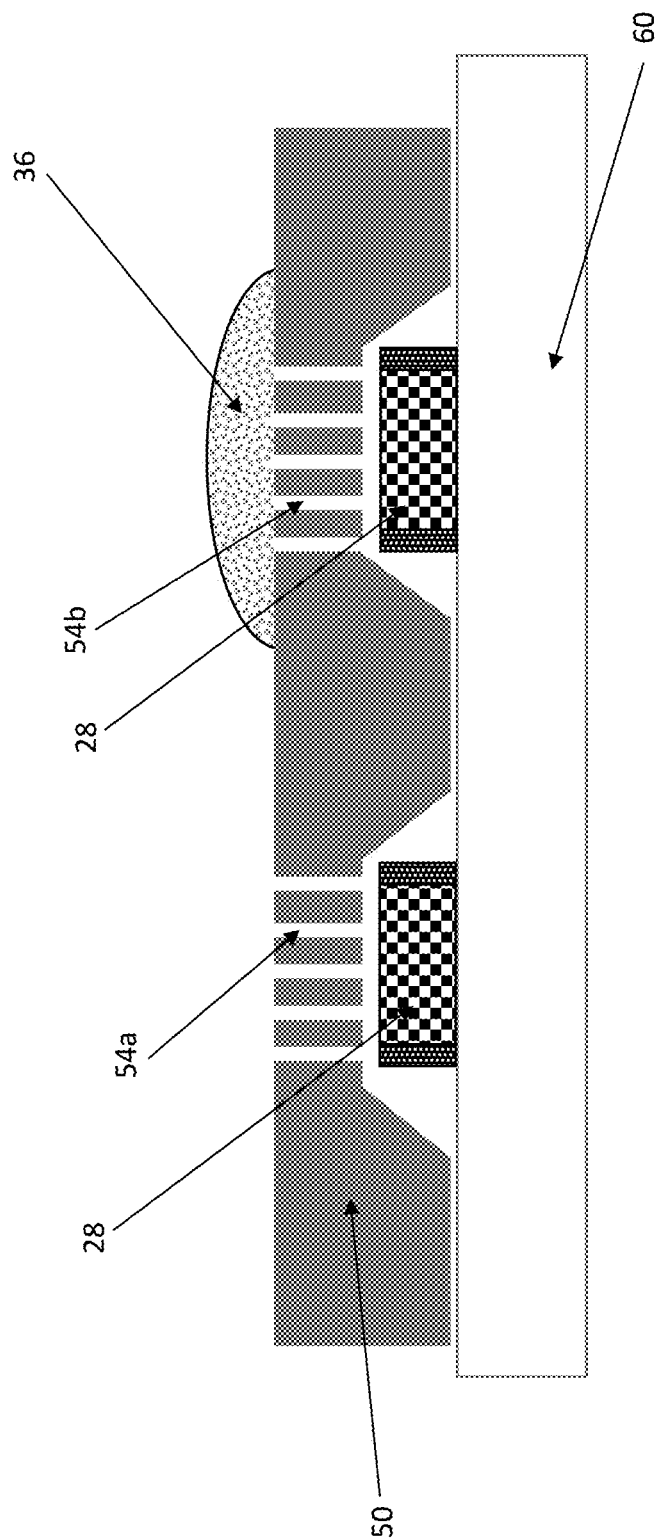
FIGS. 14a-14e illustrate aspects of the picking of components using both movement and vacuum, in accordance with a further embodiment of the present invention.

Referring to FIGS. 14a-14e, the actions of picking a component are illustrated in greater detail. As shown in FIG. 14a, initially the picking substrate 50 approaches the donor substrate 60 that includes components 28. Some holes 54a are open while other holes 54b are closed (or at least partially so) by dots of liquid 36 printed by the inkjet print head 20. The dots 36 are disposed on the side of the picking substrate 50 opposite the components 28 so as not to contaminate the components 28 when the picking substrate 50 is in proximity thereto.

Figure 14B:
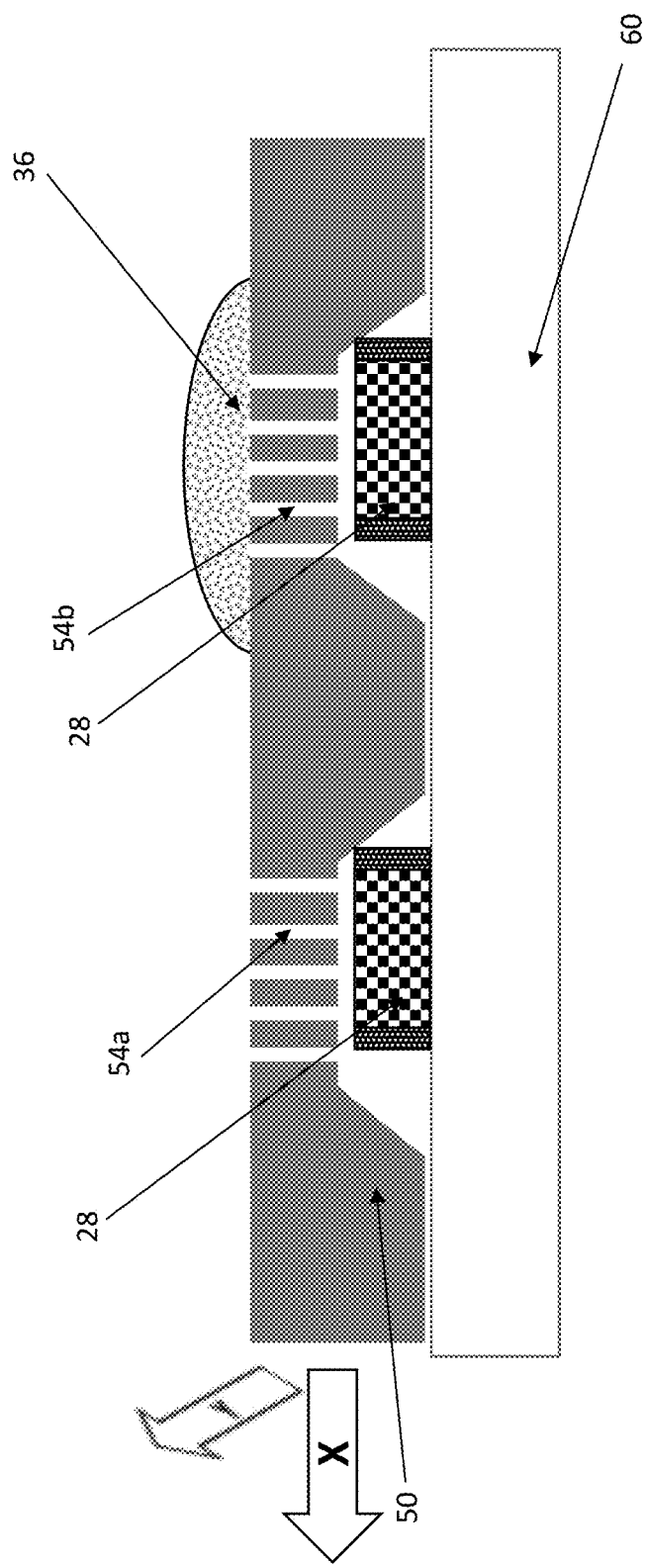
Figure 14C:
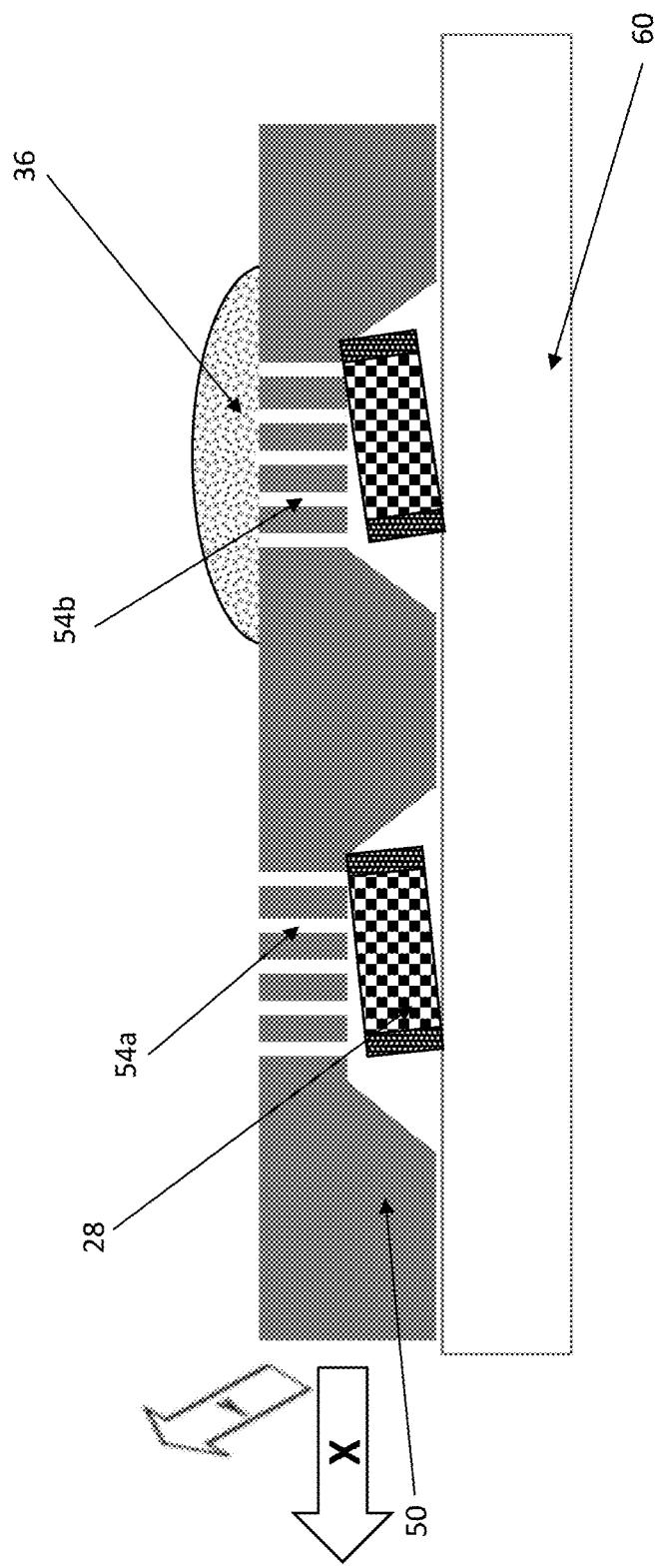
Figure 14D:
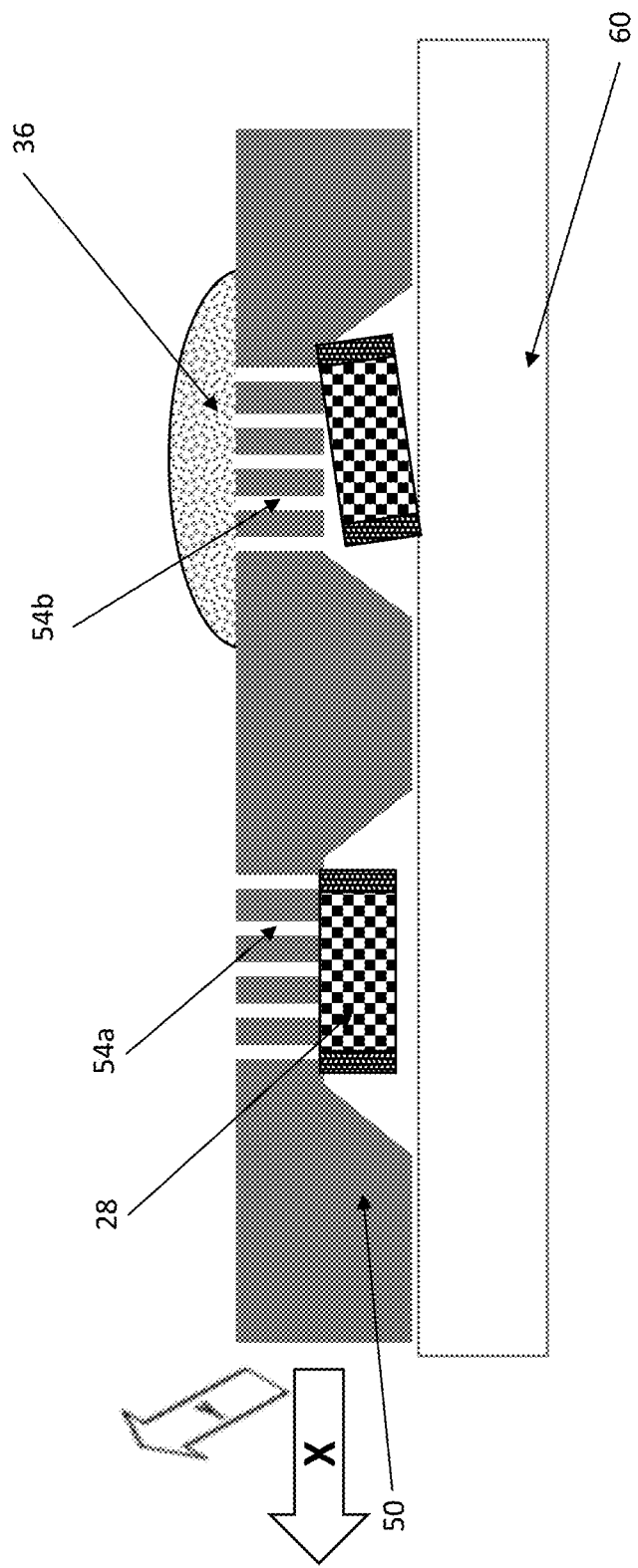
Figure 14E:
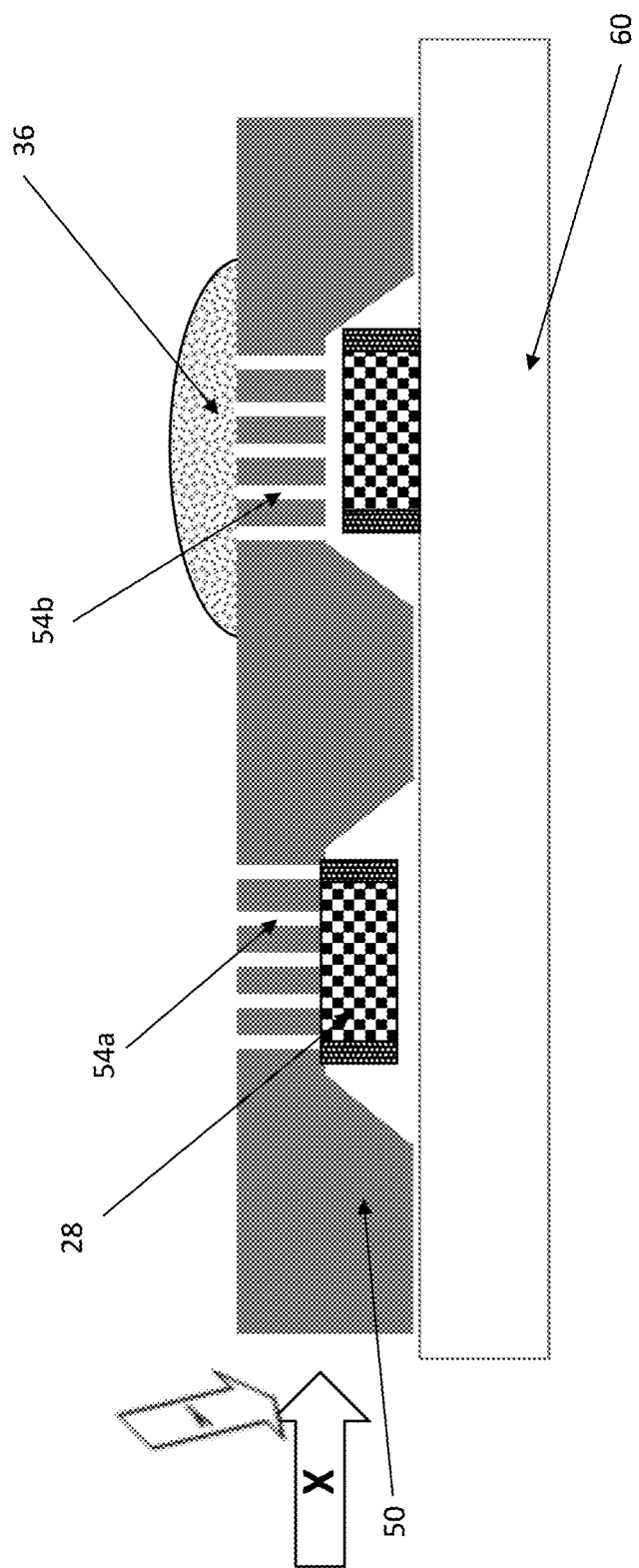

Referring to FIG. 14b, to ensure that all the components 28 fit into the holes in the picking substrate 50, the picking substrate 50 can be moved or vibrated in the X-Y directions to compensate for small variations between the picking substrate's structure and the components' ordering. During this movement or vibration, a vacuum may already be applied to the picking head, so that components may be displaced somewhat from the donor substrate 60 towards the picking substrate 50, as shown in FIG. 14c. Since some of the holes 54b of the picking substrate 50 are closed, at least partially, by dots of liquid 36, components disposed under these "deactivated" holes 54b will not be able to be fully captured by the picking substrate 50 and those components disposed under open picking holes 54a will be captured at the end of the process (see FIGS. 14d and 14e). To ensure no unwanted components remain adhered to the picking substrate 50 during the picking process, the vibration of the picking head may be maintained, for example in alternate directions and/or frequencies to those initially employed, as the picking substrate 50 is displaced from the location at which the components 28 are picked (see FIG. 14e).

Figure 15A:
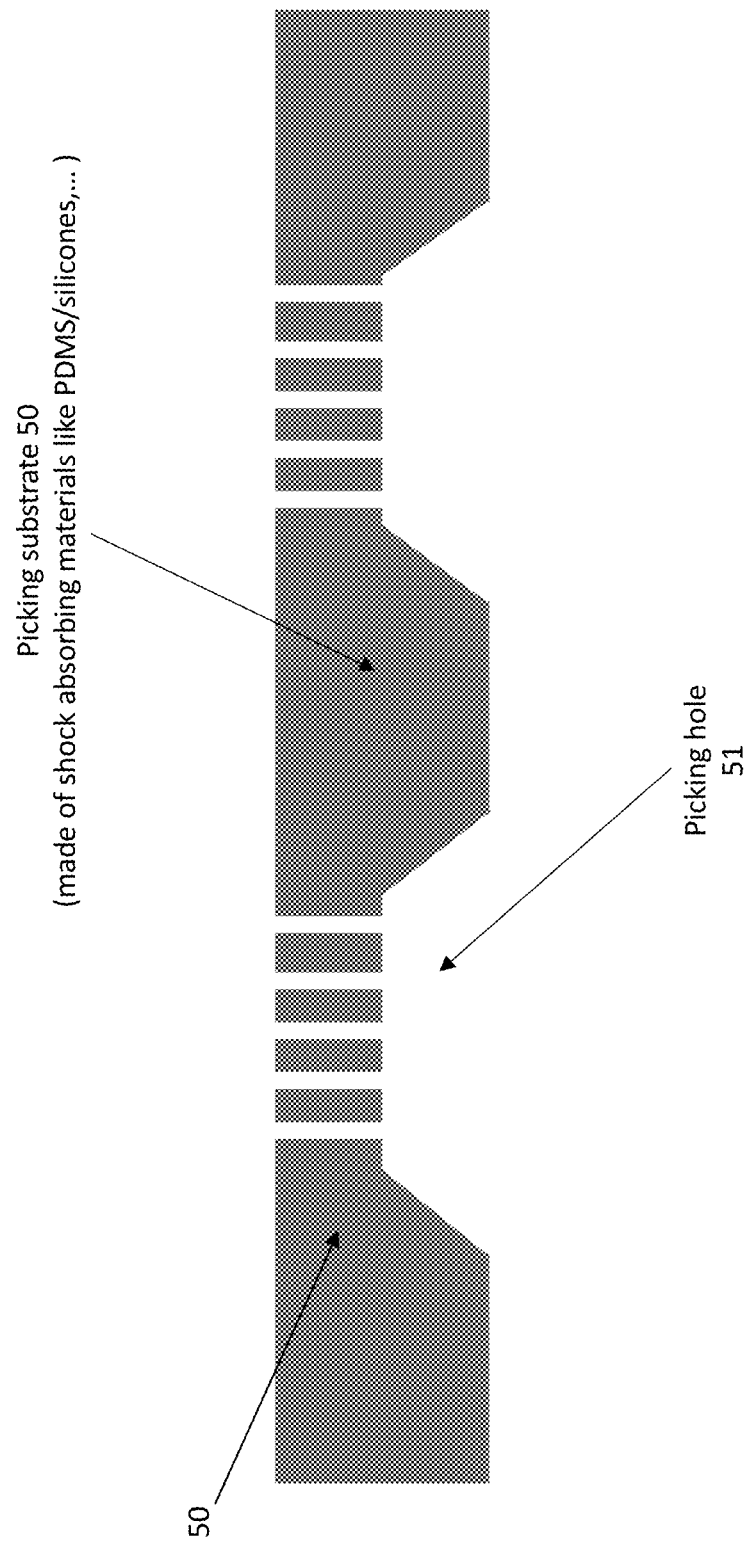
FIGS. 15a-15c illustrate examples of structures that may be used for picking and placing of components, in accordance with embodiments of the invention.
Figure 15B:
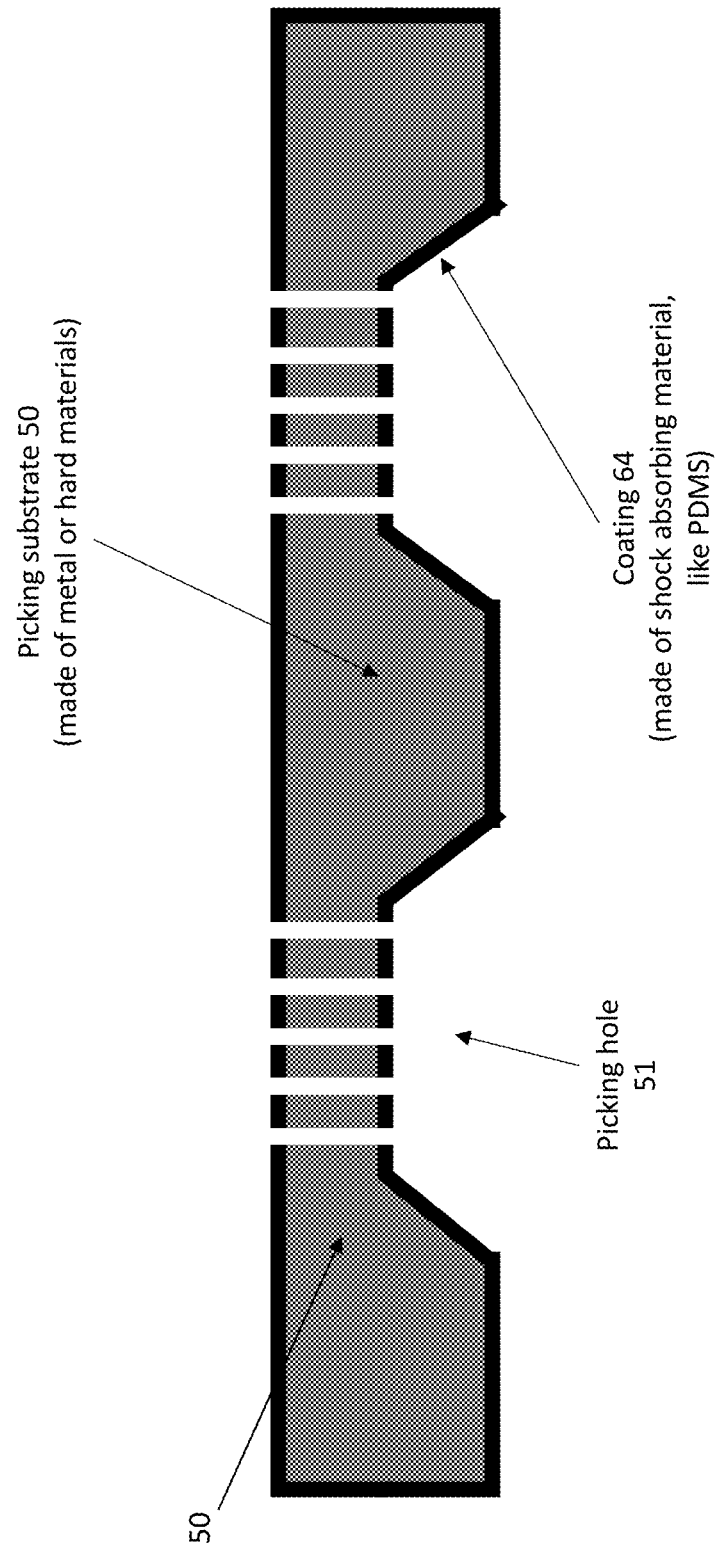
Figure 15C:
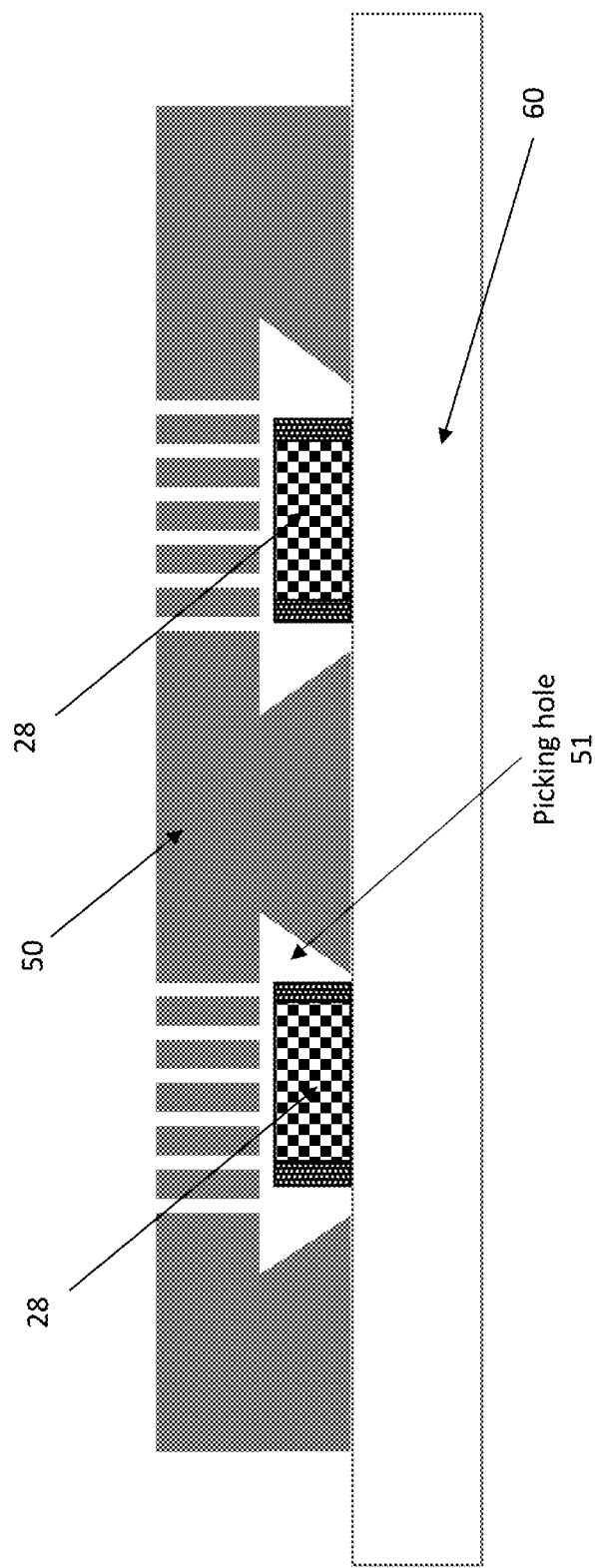

FIGS. 15a-15c illustrate some options for the structure and composition of the picking substrate 50. Since the picking and the placing of components can create significant forces on the components, and to prevent possible damage thereto, the structure of the picking substrate and its composition should be considered very carefully. To that end, several approaches can be used to reduce the forces applied to the components and/or to adjust the vacuum forces impinging on the components during the pick and place operation.

FIGS. 15a and 15b illustrate examples of compositions that can be used to reduce the forces applied on the components. The picking substrate 50 can be produced from a rubbery material (see FIG. 15a), for instance a highly accurate PDMS (polydimethylsiloxane, also known as dimethylpolysiloxane or dimethicone) structure that can be fabricated with features having a submicron resolution (see, e.g., RSC Adv., 2015, 5, 66294). The rubber material is used as a shock absorber and, therefore, the forces applied on the components during pick and place operations are attenuated. It is also possible to use a metal or ceramic picking substrate 50 with a rubber coating (see FIG. 15b). Further, to concentrate the vacuum forces and enhance placement accuracy, the picking substrate 50 can be fabricated in such a way that the components 28 occupy most of the volume (e.g., more than 50% of the volume) within the picking holes 51, but air paths around the sides of the components 28 remain unobstructed to enable a stream of air from the sides of the component 28 to maintain a strong vacuum during the pick and place process (FIG. 15c). Conceptually, the objective is to hold a component in a confined space with as small as possible space for the component to move in order to increase the component placement accuracy, while at the same time making sure that the component can enter the picking hole 51 in the picking substrate given the size tolerance of the component.

Figure 16:
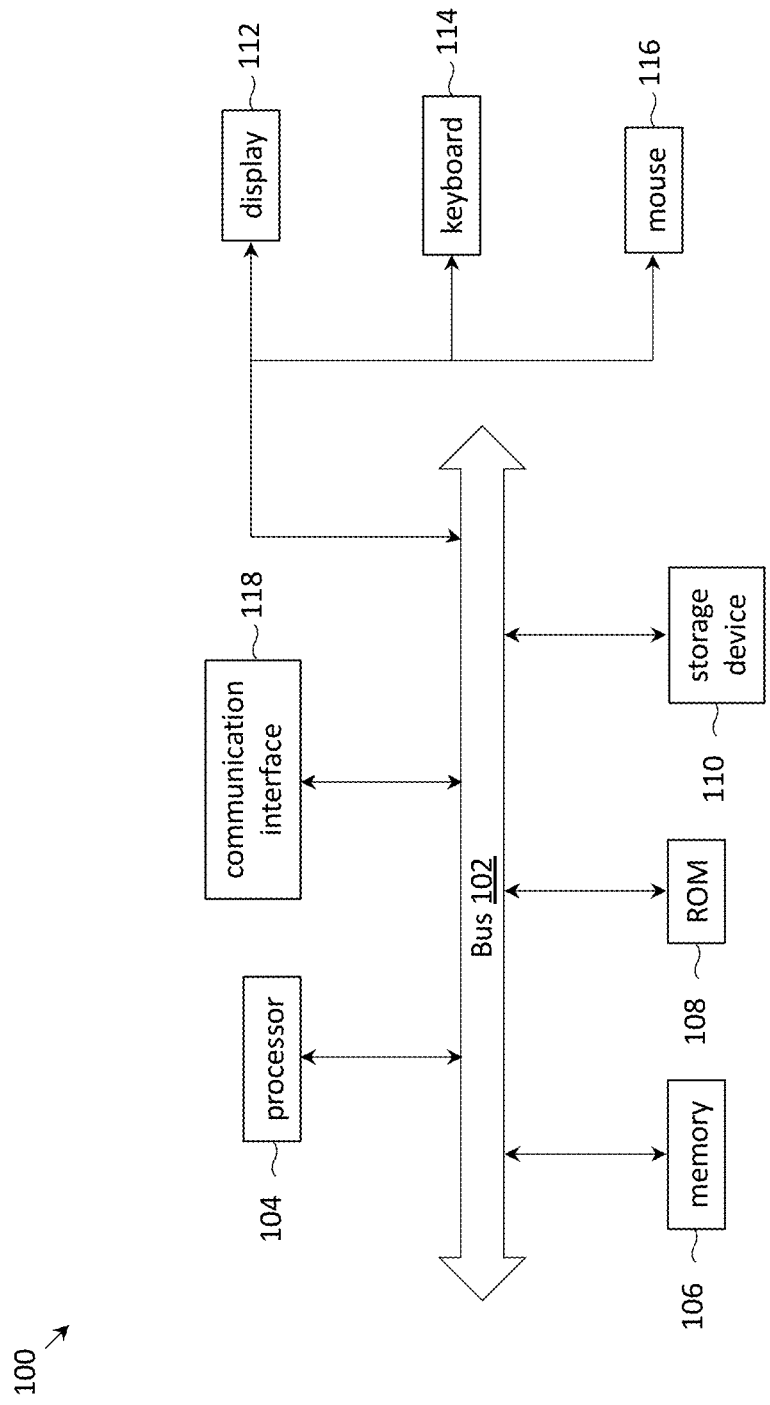
FIG. 16 depicts components of a computer system in which computer readable instructions instantiating the methods of the present invention may be stored and executed.

FIG. 16 provides an example of system 100 that may be representative of any of the computing systems (e.g., controller 10) discussed herein. Note, not all of the various computer systems have all of the features of system 100. For example, certain ones of the computer systems discussed above may not include a display inasmuch as the display function may be provided by a client computer communicatively coupled to the computer system or a display function may be unnecessary. Such details are not critical to the present invention.

System 100 includes a bus 102 or other communication mechanism for communicating information, and a processor 104 (e.g., a microcontroller, an ASIC, a CPU, etc.) coupled with the bus 102 for processing information. Computer system 100 also includes a main memory 106, such as a random access memory (RAM) or other dynamic storage device, coupled to the bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to the bus 102 for storing static information and instructions for the processor 104. A storage device 110, for example a hard disk, flash memory-based storage medium, or other storage medium from which processor 104 can read, is provided and coupled to the bus 102 for storing information and instructions (e.g., operating systems, applications programs and the like).

Computer system 100 may be coupled via the bus 102 to a display 112, such as a flat panel display, for displaying information to a computer user. An input device 114, such as a keyboard including alphanumeric and other keys, may be coupled to the bus 102 for communicating information and command selections to the processor 104. Another type of user input device is cursor control device 116, such as a mouse, a trackpad, or similar input device for communicating direction information and command selections to processor 104 and for controlling cursor movement on the display 112. Other user interface devices, such as microphones, speakers, etc. are not shown in detail but may be involved with the receipt of user input and/or presentation of output.

The processes referred to herein may be implemented by processor 104 executing appropriate sequences of computer-readable instructions contained in main memory 106. Such instructions may be read into main memory 106 from another computer-readable medium, such as storage device 110, and execution of the sequences of instructions contained in the main memory 106 causes the processor 104 to perform the associated actions. In alternative embodiments, hard-wired circuitry or firmware-controlled processing units may be used in place of or in combination with processor 104 and its associated computer software instructions to implement the invention. The computer-readable instructions may be rendered in any computer language.

In general, all of the above process descriptions are meant to encompass any series of logical steps performed in a sequence to accomplish a given purpose, which is the hallmark of any computer-executable application. Unless specifically stated otherwise, it should be appreciated that throughout the description of the present invention, use of terms such as "processing", "computing", "calculating", "determining", "displaying", "receiving", "transmitting" or the like, refer to the action and processes of an appropriately programmed computer system, such as computer system 100 or similar electronic computing device, that manipulates and transforms data represented as physical (electronic) quantities within its registers and memories into other data similarly represented as physical quantities within its memories or registers or other such information storage, transmission or display devices.

Computer system 100 also includes a communication interface 118 coupled to the bus 102. Communication interface 118 may provide a two-way data communication channel with a computer network, which provides connectivity to and among the various computer systems discussed above. For example, communication interface 118 may be a local area network (LAN) card to provide a data communication connection to a compatible LAN, which itself is communicatively coupled to the Internet through one or more Internet service provider networks. The precise details of such communication paths are not critical to the present invention. What is important is that computer system 100 can send and receive messages and data through the communication interface 118 and in that way communicate with hosts accessible via the Internet.

Thus, systems and methods for inkjet or laser based pick and place machine at high speed have been described. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A system for surface mounting electronic components on a printed circuit board, the system comprising:
   a vacuum cell configured for picking the electronic components; and
   an inkjet print head configured to cause a first one of the electronic components to detach from the vacuum cell by emitting one or more droplets of a solvent towards a surface of the vacuum cell at which the first electronic component is held to break a holding vacuum of the vacuum cell exerted on the first electronic component at a desired release point.

2. The system of claim 1, wherein the vacuum cell is closed by a porous substrate or a micro hole array plate on at least one side or part thereof.

3. The system of claim 1, further comprising a controller configured to control a temperature and humidity of the vacuum cell.

4. The system of claim 1, wherein the inkjet print head is translatable inside the vacuum cell by a piezo element.

5. The system of claim 1, wherein the electronic components include one or more of a resistor, a light emitting diode (LED) or an integrated circuit (IC).

6. The system of claim 1, further comprising an inspection station configured to inspect the electronic components as held by the vacuum cell before placement of the electronic components on a receiving substrate or after placement of the electronic components on the receiving substrate.

7. The system of claim 1, wherein the solvent is selected according to a vacuum level and temperature and is one of: water, ethanol, glycol or an organic solvent.

8. The system of claim 1, wherein the inkjet print head is configured to cause the electronic components to detach from the vacuum cell and includes multiple nozzles to pick and place multiple ones of the electronic components at the same time.

9. The system of claim 1, wherein the vacuum cell includes a substrate structured so as to reduce solvent penetration, to reduce electrostatic forces on one of the electronic components when attached thereto, and to align the one of the electronic components to a target area in X, Y, and Z directions.

10. A system for surface mounting electronic components on a printed circuit board, the system comprising:
    a vacuum cell configured for picking the electronic components; and
    a laser-based element configured to cause a first one of the electronic components to detach from the vacuum cell by heating a solvent at a detachment point inside the vacuum cell, wherein a vapor pressure of the solvent and a pressure inside the vacuum cell are selected with respect to one another so that the solvent vaporizes upon the heating of the solvent.

11. The system of claim 10, wherein the vacuum cell is closed by a porous substrate or a micro hole array plate on at least one side or part thereof.

12. The system of claim 10, further comprising a controller configured to control a temperature and humidity of the vacuum cell.

13. The system of claim 10, wherein the electronic components include one or more of a resistor, a light emitting diode (LED) or an integrated circuit (IC).

14. The system of claim 10, further comprising an inspection station configured to inspect the electronic components as held by the vacuum cell before placement of the electronic components on a receiving substrate or after placement of the electronic components on the receiving substrate.

15. The system of claim 10, wherein the solvent is selected according to a vacuum level and temperature and is one of: water, ethanol, glycol or an organic solvent.

16. The system of claim 10, wherein the vacuum cell includes a substrate structured so as to reduce solvent penetration, to reduce electrostatic forces on one of the electronic components when attached thereto, and to align the one of the electronic components to a target area in X, Y, and Z directions.

* * * * *